US 7,846,350 B2

(12) United States Patent
Chen et al.

(10) Patent No.: US 7,846,350 B2
(45) Date of Patent: Dec. 7, 2010

(54) HIGHLY SATURATED RED-EMITTING MN(IV) ACTIVATED PHOSPHORS AND METHOD OF FABRICATING THE SAME

(75) Inventors: Teng-Ming Chen, Hsinchu (TW); Juih-Tzer Luo, Hsinchu (TW)

(73) Assignee: National Chiao-Tung University, Hsinchu (TW)

(*) Notice: Subject to any disclaimer, the term of this patent is extended or adjusted under 35 U.S.C. 154(b) by 525 days.

(21) Appl. No.: 11/593,799

(22) Filed: Nov. 7, 2006

(65) Prior Publication Data

US 2008/0061674 A1    Mar. 13, 2008

(30) Foreign Application Priority Data

Sep. 12, 2006   (TW) .............. 95133622 A

(51) Int. Cl.
*C09K 11/80* (2006.01)
*C09K 11/66* (2006.01)
*C09K 11/67* (2006.01)
*C09K 11/55* (2006.01)
*C09K 11/56* (2006.01)

(52) U.S. Cl. ............. 252/301.4 F; 252/301.4 R; 257/98; 313/503

(58) Field of Classification Search ............ 252/301.4 F, 252/301.4 R; 313/503; 257/98
See application file for complete search history.

(56) References Cited

U.S. PATENT DOCUMENTS

| 2,447,448 A * | 8/1948 | Williams ............ 252/301.4 F |
| 2,479,158 A * | 8/1949 | Froelich ............ 252/301.4 F |
| 4,652,143 A * | 3/1987 | Wickersheim et al. ...... 374/161 |
| 6,157,126 A | 12/2000 | Yano et al. |
| 6,555,958 B1 * | 4/2003 | Srivastava et al. ........... 313/506 |
| 6,601,962 B1 * | 8/2003 | Ehara et al. ................. 362/612 |
| 2007/0035813 A1 * | 2/2007 | Roth et al. .................. 359/350 |

FOREIGN PATENT DOCUMENTS

| GB | 952630 | 3/1964 |
| GB | 2089502 | 11/1981 |
| JP | 2004-335579 | * 11/2004 |
| WO | WO 2004/056940 | * 7/2004 |

OTHER PUBLICATIONS

T. Murata et al., "Fluorescence properties of $Mn^{4+}$ in $CaAl_{12}O_{19}$ compounds as red-emitting phosphor for white LED", Journal of Luminescence(2005), 114, pp. 207-212.

(Continued)

*Primary Examiner*—C. Melissa Koslow
(74) *Attorney, Agent, or Firm*—Buckman and Archer

(57) ABSTRACT

The present invention provides a light emitting device comprising a semiconductor light source emitting radiation at about 250~500 nm; and a phosphor composition radiationally coupled to the semiconductor light source, wherein the phosphor composition is selected from the group consisting of $Mg_{14}(Ge_{(5-a)}Mn_a)O_{24}$, $Sr(Ge_{(4-b)}Mn_b)O_9$, $Mg_2(Ti_{(1-c)}Mn_c)O_4$, $Zn_2(Ti_{(1-d)}Mn_d)O_4$, $SrMg(Al_{(10-e)}Mn_e)O_{17}$, and $Y_3(Ga_{(5-f)}Mn_f)O_{12}$.

13 Claims, 18 Drawing Sheets

OTHER PUBLICATIONS

G. Blasse et al., "Photoluminescent Efficiency of Phosphors with Electronic Transitions in Localized Centers", J.Electrochem.Soc.: Solid State Science (Oct. 1968), vol. 115, pp. 1067-1075.

M. Travnicek, "The Luminescence of Basic Magnesium Arsenate Activated by Manganese", Physica, (Jan. 1952), vol. 18, No. 1, pp. 33-42.

G. Kemeny et al, "Activator Center in Magnesium Fluorogermanate Phosphors", The Journal of Chemical Physics (Sep. 1960), vol. 33, No. 3, pp. 783-789.

L.A. Riseberg et al., "Spectrum and Anomalous Temperature Dependence of the $^2E \rightarrow ^4A_2$ Emission of $Y_3Al_5O_{12}:^{Mn4+}$" Solid State Communications, (Feb. 1971), vol. 9, pp. 791-794.

Arnost Bergstein et al., "Manganese-Activated Luminescence in $SrAl_{12}O_{19}$ and $CaAl_{12}O_{19}$" J. Electrochem. Soc.: Solid State Science, (Jul. 1971) ,pp. 1166-1171.

E. Kostiner et al ., "A Note on Manganese-Activated Magnesium Arsenate" (Apr. 1972), J. Electrochem. Soc.: Solid-State Science and Technology, pp. 548-549.

A.G.Paulusz, "Efficient Mn(IV) Emission in Fluorine Coordination" J. Electrochem. Soc.: Solid-State Science and Technology (Jul. 1973), pp. 942-947.

A.M. Srivastava et al., "Luminescence of $Mn^{4+}$ in the Distorted Perovskiet $Gd_2MgTio_6$" (Sep. 1996) J. Electrochem. Soc., vol. 143, No. 9, pp. L203-L205.

A.V. Shamshurin et al., "$Mn^{4+}$ Luminescence in $2MgO \cdot GeO_2$ and $2MgO\ 7 \cdot GeO_2 \cdot MgF_2$" (Jul. 1998), Inorganic Materials, vol. 36, No. 6, pp. 629-631.

Z. Bryknar et al., "Luminescence spectra of $SrTiO_3 : Mn^{4+}$" (2000) Journal of Luminescence 87-89 pp. 605-607.

R.B. Von Dreele et al., "The Crystal Structure of Magnesium Germanate: A Reformulation of $Mg_4GeO_6$ as $Mg_{28}Ge_{10}O_{48}$" (Jul. 1970), Journal of Solid State Chemistry 2, pp. 612-618.

* cited by examiner

HIGHLY SATURATED RED-EMITTING MN(IV) ACTIVATED PHOSPHORS AND METHOD OF FABRICATING THE SAME

FIELD OF THE INVENTION

The present invention relates to a phosphor composition, particularly a phosphor composition for light emitting devices.

DESCRIPTION OF THE RELATED PRIOR ART

The use of light-emitting diodes (LED) for generating white light similar to sunlight, in order to generally replace traditional lighting by fluorescent lamps, has been extensively studied as a main object in the lighting field. Comparing to traditional lighting, the generation of white light by LEDs is advantageous in no mercury pollution, low power consumption, high efficiency, etc. Two mechanisms have been utilized by current single-chip white light LEDs technique. First, UV-LED chip emitting wavelength below 400 nm is used as light source to excite phosphors emitting red, green and blue (RGB) lights, which are mixed to be white light; second, blue LED chip is used to excite yellow phosphor to generate white light. In the first mechanism, a variety of phosphors with proper coordinative property and deterioration degree are used to control quality of white light; and in the second mechanism, it is very important to use proper yellow phosphor, and none has known yet other than the current used YAG phosphor (patented by Japan Nichia Corporation). Further, white light is always generated by mixing luminescence with different wavelengths emitting from two or more phosphors. The use of single material capable of emitting white light greatly simplifies producing process and has been a main object in this field.

LED, due to energy saving, environment friendly, and durable in use, is useful as light source for cars, mobile phones, panel backlights, and traffic signals, as well as daily life; it is possible that use of LEDs will replace traditional lighting. LED consumes electricity only 10~15% to that of traditional bulb. In US, for example, total cost for generating electricity is about US$60 billion per year and 21% is for lighting, of which lamps (efficiency about 5%, 7~101 m/W) use 8% and fluorescent tubes (efficiency about 20%, 35~401 m/W) use 14%; the average efficiency is about 14%. If they can be replaced with LEDs (efficiency 30%), domestic electricity consumption will be reduced by 10%. By which Optoelectronics Industry Development Association estimates, US$115 billion for electricity, 760 GW for electric energy, 258 million m$^3$ for carbon emission, and 133 power plants (capacity 1000 MW each) are reduced in 2000-2020. Further, usage life of LED is 10 times longer than that of traditional lighting equipments. With advantages like small volume, high brightness, and environment friendly in production and disposal, LED is considered the future light source.

In utilization for lighting, white light LEDs are aggressively used to replace traditional lighting. Generally, structures of white light LEDs are divided into those using phosphor compositions and those of no phosphor compositions. There are three kinds of structures using phosphors: (1) blue LED-excitable YAG phosphor composition, (2) blue LED-excitable YAG red phosphor composition, and (3) UV LED-excitable phosphor composition.

Near ultraviolet LED based on GaN is made of (Sr, Ca, Ba, Mg)$_{10}$(PO$_4$)$_6$Cl$_2$:Eu$^{2+}$, ZnS:Cu, Al, and Y$_2$O$_2$S:Eu$^{3+}$ as RGB phosphors to emit white light (T. Murata, T. Tanoue, M. Iwasaki, K. Morinaga, and T. Hase, J. Lumin., 114, 207 (2005)). Since the color saturation of Y$_2$O$_2$S:Eu$^{3+}$ as red phosphor is insufficient, color rendering of white light LED is affected so that highest color rendering index Ra is about 83. To replace traditional bulb, color warming and color rendering of white light LED need to be elevated, although efficiency is 2~3 times thereto.

(Spectral Property of Phosphor Composition)

It is found that in the spectra of phosphor compositions obtained experimentally, some show lines and some show broad bands. Relationship between electronic transition and energy level is explained by concept of configuration coordinate diagram (R. B. King, "Encyclopedia of Inorganic Chemistry", 4, John Wiley & Sons (1994)). By taking average distance between cations and anions (R$_o$) as abscissa and energy (E) as ordinate, this relationship is described by formula E=½kr$^2$ for relationship between energy and displacement of oscillator, wherein k is force constant. According to Franck-Condon Principle, since nucleus is much heavier than outer electron, its vibration frequency is much lower, so that in the quick transition process of electron, relative position and vibration frequency of atoms in the crystal are considered approximately invariable. In other words, when an electron transits from ground state to excited state, relative distance among nuclei (R) inside crystal is considered invariable. The probability of transition is highest on electrons at ground state, referring to FIG. 1 represent XRD profile. When transition ΔR=0 (ΔR=R$_o$–R), called zero-transition or non-phonon transition, all peaks in absorption or emission spectrum are sharp peaks.

However, there is not always zero-transition happened. When phonon wave propagation occurs inside main lattice and activation center to produce vibronic-coupling so that ΔR is not zero, chemical bond of excited state is different from that of ground state and generally weaker. At this time, energy levels of ground state and excited state are no longer parallel as there is a remarkable distance change (ΔR), and broad bands are shown in spectrum. When ΔR>>0, coupling of electron transition and phonon or lattice vibration is enhanced, and it is weakest when ΔR=0. Therefore, according to the relationship between ΔR and applied energy efficiency (G. Blasse and A. Bril, J. Electrochem. Soc., 115, 1067 (1968)), application efficiency is expected to be lower as ΔR increases. In the process that phosphor composition emits light, some non-radioactive or thermal relaxant behaviors are accompanied, so that energies of absorption and emission are different. Corresponding positions of wavelength are accordingly different and there is a displacement gap existing, called Stokes shift (G. Blasse and B. C. Grabmaier, "Luminescent Materials", Springer-Verlag, Berlin Heidelberg, Germany (1994)). Stokes shift can be calculated by the following formula:

$$\text{Stokes shift}=2Sh\upsilon$$

wherein S is Huang-Rhys coupling constant and represents integrating factor for electron-lattice vibration coupling; and hυ is the energy difference between two vibration energy levels. It is called weak coupling for S<1; medium coupling for 1<S<5; and strong coupling for S>5. Stokes shift is proportional to (ΔR)$^2$, so that Stokes shift increases as ΔR becomes bigger, and emission peaks shown in spectrum are getting wider.

(Transition Metal Emitting Center)

Transition metal ions generally comprise an unfilled d orbital with electron configuration d$^n$ (0<n<10). Energy levels thereof were calculated by Tanabe and Sugano based on interaction among d electrons at crystalline fields with various intensity. Generally, transition metal ion is of a broad and strong absorption band in UV area due to ligand to metal charge-transfer (LMCT); in addition, there is other absorption for crystalline field transition as selection rule allows.

For example, $Cr^{3+}$ is of additional absorption in UV or VIS spectral region after charge-transfer. In terms of light emitting mechanism, crystalline field has a larger effect on emitting behavior of transition metal ion that various intensities result in different wavelengths. In various main lattices, activator ion is under different environments so that its exhibited emitting properties are different. Emitting property of phosphor can be predicted if effect of main lattice applied thereto is known. Among others, there are two main factors: covalency and intensity of main crystalline field. Interaction among electrons is weaker as covalency increases. Transition energy of electron across different energy levels is determined by interaction among electrons, so that increased covalency contributes electronic transition corresponding thereto shifting to lower level. As main lattice is of higher covalency, electronegativity difference between cation and anion thereof is reduced, and transition energy of charge-transfer corresponding thereto accordingly shifts to lower level.

As various main lattices have different intensities, splitting of energy level is resulted. Most commonly seen, for transition metal ions having d orbitals, the wavelength corresponding to electron transition depends on intensity of crystalline field; transition metal ions having different electron configurations are affected by strength of crystal field to cause energy level difference. For example, $Al_2O_3$:$Cr^{3+}$ and $Cr_2O_3$ have identical structure but obviously different colors, $Al_2O_3$:$Cr^{3+}$ is red and $Cr_2O_3$ is green. It is because in $Al_2O_3$:$Cr^{3+}$ with the smaller lattice dimension, $Cr^{3+}$ ion occupies smaller $Al^{3+}$ lattice site hence the strength of crystal field is enhanced, so that transition energy thereof is higher than $Cr^{3+}$ in $Cr_2O_3$. Therefore, the environment where lattice is at can be observed through this kind of emitting center. As to rare earth ions, due to shielding effect of electrons at 5s and 5p orbitals, electrons in inner 4f orbital are slightly affected by crystalline field.

(Quantum Efficiency of Phosphor Composition)

Quantum efficiency (QE) of phosphor composition is defined by following equation:

QE=number of emitted photons/number of absorbed photons

In terms of energy, it is the ratio of total energy of emission to absorption. Then QE is expressed as:

$QE=\{(ID\lambda)_{emission}/(ID\lambda)_{absorption}\}\{(1-R)_{absorption}/(1-R)_{emission}\}$ wherein I represents intensity, λ represents wavelength, and R represents reflectivity obtained by comparing reflection energy in absorption spectrum.

Excellent phosphor compositions are of QE value at 80% or above. By specifying S for standard sample and U for unknown sample, quantum efficiency of unknown sample is:

$(QE)_U=(QE)_S\times\{(\Sigma Ed\lambda_{ex})_S\}/\{(\tau Ed\lambda_{ex})_U\}\times\{(\Sigma Ed\lambda_{em})_U\}/\{(\tau Ed\lambda_{em})_S\}\times\{(1-R)_S\}/\{(1-R)_U\}$ wherein E represents energy, $\lambda_{ex}$ and $\lambda_{em}$ represent the excitation and emission wavelength, respectively, and $Ed\lambda_{ex}$ represents the absorption.

(Chromaticity Coordinate)

Two colors visually feeling the same may actually composed of lights with different wavelength from each other. Based on the three primary colors, i.e., red, blue and green, visually various colors are exhibited by composing at various ratios, according to the Trichromatic Theory (H. Mizuno, Fundamental Opto-Mechtronics, Chapter 5, Fu-Han Publishing Ltd., 1993). Commission Internationale de l'Eclairage (CIE) has determined equivalent unit for primary colors, and luminous flux of standard white light is $\Phi r$:$\Phi g$:$\Phi b$=1:4.5907:0.0601. As equivalent unit for primary colors is determined, color combination relationship for white light Fw=1[R]+1[G]+[B], wherein R represents red light, G represents green light, and B represents blue light.

To light F with any color, color combination formula thereof is Fw=r[R]+g[G]+b[B], wherein r, g and b represents coefficients of red, blue and green, respectively, determined experimentally. Corresponding luminous flux is $\Phi$=680(R+4.5907G+0.0601B) lumens (lm, illumination unit), wherein the ratio among r, g and b determines chromaticness (degree of color saturation), and the numeral determines brightness of combined color. Relationship of three primary colors r[R], g[G] and b[B] is expressed by matrix after normalization: $F=X[X]+Y[Y]+Z[Z]=m\{x[X]+y[Y]+z[Z]\}$, wherein m=X+Y+Z, and x=(X/m), y=(Y/m) and z=(Z/m). Each emitting wavelength has specific r, g and b values. By specifying sum of all values in VIS area as X, sum of g values as Y, and sum of b values as Z, then chromaticity of phosphor composition can be expressed by x, y coordinate system, which is named C.I.E. 1931 Standard Colorimetric System (C.I.E. Chromaticity Coordinate). So that when a spectrum is measured, contribution from lights of each wavelength are calculated, then exact position on chromaticity coordinate is pointed, and color of light emitting from phosphor composition is thus defined.

($Mn^{4+}$ Phosphor Composition)

The composition of magnesium germanate phosphor was first discovered by Williams (F. E. Williams, J. Opt. Soc. Am., 37, 302, 1947) in 1947. Modification to MgO ratio in original $2MgO.GeO_2$:0.01Mn red phosphor composition results in phosphor composition of $4MgO.GeO_2$:0.01Mn with best emitting efficiency that is improved up to 5 times.

Patten and Williams, et al. (S. H. Patten and F. E. Williams, J. Opt. Soc. Am., 39, 702, 1949) disclosed spectroanalysis for magnesium germanate phosphor composition at various temperatures, which established that broadening of emitting peaks is proportional to square root of temperature, and suggested that electron configuration of activator at emitting state is related to temperature.

Kroeger Boomgaard of Royal Philips Electronics of the Netherlands (F. A. Kroeger and J. Van Den Boomgaard, J. Electrochem. Soc., 97, 377, 1950) studied on producing process and photoluminescence behavior of $4MgO.GeO_2$:0.01Mn phosphor composition, and suggested that phosphor with strongest emitting was obtained by preheating in nitrogen and sintering in air with solid state synthesis. Emission spectrum consists of 7 narrow peaks with different intensities, in which first 3 from the same energy level and the other 4 from another energy level are finally relaxed to ground state of different vibration energy levels. Mn activator is determined to be +4 in valence according to the observed narrow peaks instead of broad peaks.

Travnicek (F. A. Kroger, T H. P. J. Botden and P. Zaim, Physica., 18, 33, 1952) described luminescence property of $6MgO.As_2O_5$:$Mn^{4+}$ phosphor composition. Travnicek studied on effect of MgO of various amount in main body on emitting, and concluded that quantum efficiency of phosphor composition is highest at $MgO$:$As_2O_5$=6:1. Difference between structures of $6MgO.As_2O_5$ and $3MgO.As_2O_5$ can be found according to X-ray data; and it is found that exciting $6MgO.As_2O_5:Mn^{4+}$ with near ultraviolet results a red light spectrum with 5 narrow accompanied peaks.

Kemeny and Q Haake (G. Kemeny and C. H. Haake, J. Chem. Phys., 33, 783, 1960) studied on emitting center of $3.5MgO.0.5MgF_2.GeO_2:Mn^{4+}$ phosphor composition and described that $Mn^{4+}$ occupies central octahedron formed by oxygen atoms. Similar to the above Boomgaard's literature, there are 7 narrow peaks in emitting spectrum of said composition. To explain energy transfer by Tanabe-Sugano diagram of $d^3$ transition metal, when crystalline field intensity parameter Dq is $2,400 \text{ cm}^{-1}$, peaks at $35,000 \text{ cm}^{-1}$ and $24,000 \text{ cm}^{-1}$ in absorption spectrum originate from energy transfer of $^4A_2 \rightarrow ^4T_1$ and $^4A_2 \rightarrow ^4T_2$, respectively.

Riseberg and Weber (L. A. Riseberg, M. J. Weber, Solid State Commun, 9, 791, 1971) established a model for relationship between energy transfer of $^2E \rightarrow ^4A_2$ and temperature in phosphorescence spectrum of $Y_3Al_5O_{12}:Mn^{4+}$, and measured non-radioactive decay rate of energy transfer of $^2E \rightarrow ^4A_2$.

Bergstein and White (A. Bergstein and W. B. White, J. Electrochem. Soc., 118, 1166, 1971) studied the producing processes of $SrAl_{12}O_{19}:Mn$ and $CaAl_{12}O_{19}:Mn$ phosphor compositions and described that, when oxidizing atmosphere is used in sintering process, resultant phosphor composition emits red light, however, when reducing atmosphere is used, resultant phosphor composition emits green light from $Mn^{2+}$, therefore it was suggested that $Mn^{4+}$ occupies octahedral lattice while $Mn^{2+}$, occupies tetrahedral lattice.

Kostiner and Bless (E. Kostiner and P. W. Bless, J. Electrochem. Soc., 119, 548, 1972) improved synthesis of $6MgO.As_2O_5:Mn^{4+}$ phosphor composition and suggested use of PbO as flux. Also phosphorescence property thereof and $3.5MgO.0.5MgF_2.GeO_2:Mn^{4+}$ were compared.

English scientist Paulusz (A. G. Paulusz, J. Electrochem. Soc., 120, 942, 1973) discussed efficiency of $Mn^{4+}$ phosphor composition in terms of F coordination and chemical bonding property of $MnF_6^{2-}$, and explained with form coordinate. It was enhanced that when degree of σ-antibonding at $e_g$ orbital decreases, degree of π-antibonding at $t_{2g}$ orbital increases, therefore emitting efficiency is excellent and quenching temperature is high. Also, phosphorescence property of fluorides and oxides such as $K_2SiF_6:Mn^{4+}$, $K_2GeF_6:Mn^{4+}$, $K_2TiF_6:Mn^{4+}$, etc. were compared.

Stade, et al. (J. Stade, D. Hahn and R. Dittmann, J. Lumin., 8, 318, 1974) explained emitting property of $Mg_2TiO_4:Mn^{4+}$ phosphor composition that emitting of said composition is related to not only $Mn^{4+}$, but also N-centers formed with unknown defects, wherein energy is transferred from 2E to N-centers when UV is absorbed; however, when energy for $^4A_2 \rightarrow ^2E$ is absorbed, it is useful to excite N-centers. Also, it found that narrow degree of peak varies with annealing condition in producing process, and suggested that emitting peaks at 697.8 and 699.4 nm originate from minor $MgTiO_3:Mn^{4+}$ in the system.

Srivastava and Beers (A. M. Srivastava and W. W. Beers, J. Electrochem. Soc., 143, 203, 1996) studied on effect of $Mn^{4+}$ on emitting in distorted perovskite $Gd_2MgTiO_6$. Absorption peak at $31,700 \text{ cm}^{-1}$ representing charge transfer of $O^{2-} \rightarrow Mn^{4+}$, and emitting peak at $14,685 \text{ cm}^{-1}$ representing zero phonon transfer of $^2E \rightarrow ^4A_2$, with accompanied peaks at longer wavelengths, are found in emitting spectrum, due to $Mn^{4+}$ at various lattices as suggested. It was described that six-coordinate $Mn^{4+}$ occupies octahedral lattice and estimated Dq is $2,066 \text{ cm}^{-1}$, coupling of $\upsilon_3$ and $\upsilon_4$ vibration mode in octahedron relaxes by selection rule, and $^8S \rightarrow ^6P$ emitting of $Gd^{3+}$ itself is found at 310 nm when $Mn^{4+}$ concentration is low, which happens to overlap with charge transfer of $Mn^{4+}$.

Shamshurin, et al. (A. V. Shamshurin, N. P. Efryushina and A. V. Repin, Inorg. Mater., 36, 629, 2000) described that decay lives of $Mn^{4+}$ in $2MgO.GeO_2$ and $2MgO.GeO_2.MgF_2$ are different, since deep electron capture occurs in latter to increase decay life. Comparison of ion radius shows radius of $Ge^{4+}$ (0.44 Å) is closer to that of $Mn^{4+}$ (0.52 Å) than that of $Mg^{2+}$ (0.74 Å), so that it was suggested $Mn^{4+}$ enters $Ge^{4+}$ lattice with similar radius and same charge. Also, emitting peaks at 633 and 660 nm were attributed to transfer of $^2T_1 \rightarrow ^4A_2$ and $^2E \rightarrow ^4A_2$, both may be produced by occupation of $Mn^{4+}$ in non-equivalence or distorted lattice.

Russian scientist Bryknar, et al. (Z. Bryknar, V. Trepakov, Z. Potucek and L. Jastrabik, J. Lumin., 87, 605, 2000) conducted a series of tests on $SrTiO_3:Mn^{4+}$, and described that emitting peak at $13,826.8 \text{ cm}^{-1}$ and accompanied peaks are generated by zero phonon transfer of $^2E \rightarrow ^4A_2$, which position varies with temperature thus unusual shift is produced, so that is related to dielectric property at various temperatures. Two broad absorption bands at $18,182 \text{ cm}^{-1}$ and $23,585 \text{ cm}^{-1}$ are due to transfer of $^4A_2 \rightarrow ^4T_2$ and $^4A_2 \rightarrow ^4T_1$. Comparison of $Mn^{4+}$ and $Cr^{3+}$ shows negative charge is produced when $Cr^{3+}$ substitutes $Mn^{4+}$ lattice, and larger positive charge of former makes $Mn^{4+}$ and $O^{2-}$ closer, so that wave functions of $Mn^{4+}$ and $O^{2-}$ overlap larger part to enhance interaction between $Mn^{4+}$ and lattice. When photon energy is larger than 1.9 eV and temperature is below 100 K, above-mentioned temperature effect also affects emitting intensity of phosphor composition, because electrons at superficial energy levels are captured when composition is excited to produce charge transfer of $Mn^{4+} \rightarrow Mn^{5+}$, which in turn reduces $Mn^{4+}$ concentration and results decreasing emitting intensity. On the other hand, when temperature is above 100 K, there is sufficient energy existing to enhance emitting intensity.

Bulyarskii, et al. (S. V. Bulyarskii, A. V. Zhukov and V. V. Prikhod'ko. Opt. Spectrosc., 94, 538, 2003) calculated probability of transfer of quartet $^4T_2 \rightarrow ^4A_2$ in $Gd_3Ga_5O_{12}:Mn^{4+}$ phosphor composition and compared to that of $^2E \rightarrow ^4A_2$. It was descried that it is possible for $Gd_3Ga_5O_{12}:Mn^{4+}$ phosphor composition to be useful in laser materials.

Murata, et al. (T. Murata, T. Tanoue, M. Iwasaki, K Morinaga and T. Hase, J. Lumin., 114, 207, 2005) introduced red phosphor composition $CaAl_{12}O_{19}:Mn^{4+}$ which is useful in white light LED and is prepared by traditional solid state synthesis. It was described that emitting peak at 656 nm with 3 accompanied small peaks are due to transfer of $^2E \rightarrow ^4A_2$. $CaF_2$ and $MgF_2$ are doped thereto to solve charge compensation by exchanging $Mn^{4+}$ and $Al^{3+}$ with a pair of $Ca^{2+}$ or $Mg^{2+}$, so that producing of $Mn^{2+}$ is avoided and emitting intensity is enhanced up to twice. Chromaticity coordinate shows value of (0.728, 0.269) which is highly saturated.

Generally, $Mn^{4+}$ selectively substitutes six-coordinate object in lattice. As radius size of ions similar to $Mn^{4+}$ are $Ge^{4+} > Al^{3+} > Ti^{4+} > As^{5+} > Ga^{3+} > Si^{4+}$, $Ge^{4+}$ (L. H. Ahrens., Geochim. Cosmochim. Acta, 2, 155, 1952), $Al^{3+}$ and $Ti^{4+}$ are considered to be the most suitable substitution for $Mn^{4+}$ lattice when designing phosphor compositions.

Therefore, highly saturated red phosphor composition excitable by UV is considered as possible to replace current indirect types of LEDs in the market, and capable of elevating color warming and color rendering of white light LEDs.

SUMMARY OF THE INVENTION

The present invention provides a light emitting device comprising a semiconductor light source emitting radiation at about 250~500 nm; and a phosphor composition radiationally coupled to the semiconductor light source, wherein the phosphor composition is based on $Mn^{4+}$ phosphor combined with $Mn^{4+}$ activator, prepared by solid state synthesis. Through analysis of X-ray diffraction on crystalline phases and structures, and measurement of photoluminescence spectrum, C.I.E. chromaticity coordinate, total reflection spectrum, electron energy spectrum, and quantum efficiency, with the difference of emitting property and mechanism among various lattices comprising $Mn^{4+}$, highly saturated red phosphor composition is prepared.

To avoid non-radioactively losing energy in transfer process, it is considered to improve quantum efficiency of phosphor composition and increase rigidity of main body or host lattice (by combining cation with smaller atomic mass) in selection of composition components. Therefore, designing rules for the present phosphor composition are:

1. $Mn^{4+}$ enters ion lattice sites with similar radius;
2. Substitution sites of the main body suitable for $Mn^{4+}$ is six-coordinated;
3. Excitation and emission of $Mn^{4+}$ are explainable by Tanabe-Sugano diagram for $d^3$ free ion, so that crystalline field intensity parameter (Dq) and Racah parameter (B) are estimated.
4. Cation with smaller atomic mass is used to form the main body for $Mn^{4+}$ phosphor composition to improve quantum efficiency.

Accordingly, highly saturated red phosphor composition is prepared and used in light emitting devices. The present composition is selected from the group consisting of $Mg_{14}Ge_{(5-a)}O_{24}:aMn^{4+}$, $Zn_2Ti_{(1-e)}O_4:eMn^{4+}$, and $Y_3Ga_{(5-g)}O_{12}\cdot gMn^{4+}$, wherein $0.0005 \leq a \leq 0.01$, $0.0015 \leq c \leq 0.025$, $0.0005 < e < 0.02$ $0.0005 \leq g \leq 0.015$. The best compositions are: (1) $Mg_{14}(Ge_{4.9875}Mn_{0.0125})O_2$, (2) $Sr(Ge_{3.96}Mn_{0.04})O_9$, (3) $Zn_2(Ti_{0.995}Mn_{0.005})O_4$ (4) $SrMg(Al_{9.975}Mn_{0.025})O_{17}$, and (5) $Y_3(Ga_{4.9875}Mn_{0.0125})O_{12}$.

The present composition is prepared by sintering uniformly mixed reactant powders in aluminum oxide crucible heated at 1000-1400° C. for 8 hours, then conducting analysis of X-ray diffraction on crystalline phase and crystal structure, and measurements of photoluminescence spectrum, C.I.E. chromaticity coordinate, total reflection spectrum, electron energy spectrum, and quantum efficiency of the resultant powders.

DETAILED DESCRIPTION OF THE INVENTION

Figure 1:
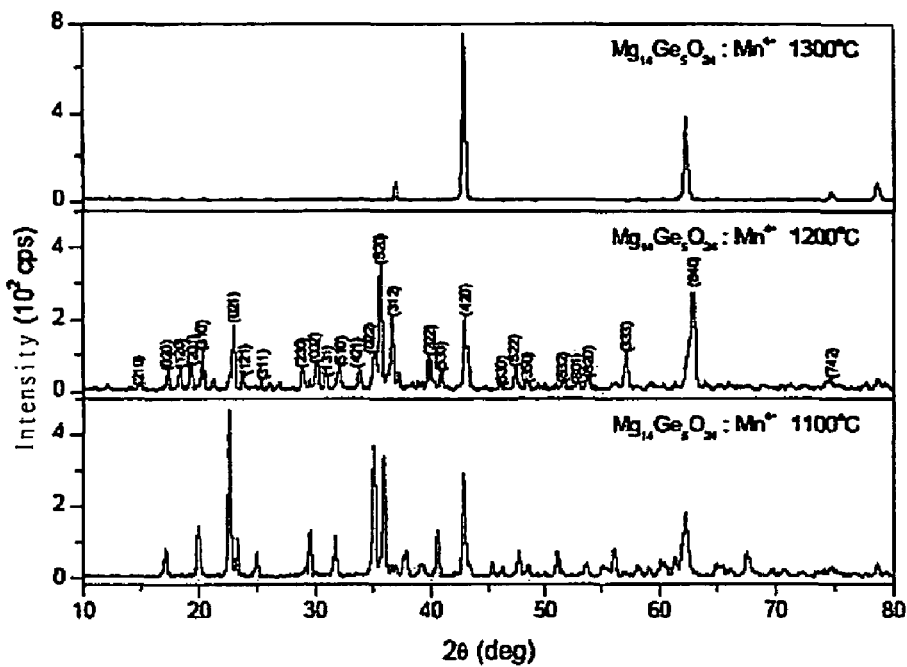
FIG. 1 shows comparison of XRD profiles from $Mg_{14}Ge_5O_{24}$ phosphor compositions synthesized at various sintering temperatures.

For a better understanding of the composition of components and mechanical properties, in addition, objects, technical description, features, and effects of the present invention by those familiar in this field, the present invention is described with reference to the following embodiments, figures and tables.

The present invention relates to a light emitting device using novel highly saturated red phosphor compositions excitable by UV.

Phosphor convertible materials (phosphor convertible compositions) is capable of transferring received UV or blue light into visible light with different wavelength that is determined by specific component in the phosphor composition. A phosphor composition is composed of single or two or more compositions. It is necessary for LED usable as light source to generate sufficiently bright and white light. In one embodiment of the present invention, a phosphor composition is coated on LED in order to generate white light. Phosphor composition emits lights of different colors when excited by lights with different wavelengths. For example, near ultraviolet or blue light LED emits visible light when excited with wavelength at 250~500 nm. Emitting visible light converted by phosphor composition is characterized to exhibit high intensity and brightness.

One of the preferred embodiments of the present invention is a light emitting device or lamp comprising a semiconductor light source, i.e., light emitting diode chip, and conductive leads connected to the chip. The conductive leads are supported by electrode sheets to provide electricity to the chip and enable radiation emitting.

Also, light emitting device can comprise blue or UV semiconductor light source, radiation generated by which is emitted on phosphor composition directly to generate white light. In a preferred embodiment of the present invention, various impurities are doped into the blue light emitting device. Therefore, the LED comprises a variety of suitable III-V, II-VI or IV-IV semiconductor (e.g., GaN, ZnSe or SiC) layers, and wavelength of emitted radiation is preferably 250~500 nm. For example, LED consisting of nitride $In_jGa_jAl_kN$ (wherein $0 \leq I$, $0 \leq j$, and $0 \leq k$; $i+j+k=1$) is capable of exciting light with wavelength longer than 250 nm and shorter than 500 nm. Above-mentioned LED is conventionally known and can be used as exciting light source in the present invention. However, the present invention is not limited thereto, and all kinds of light sources excitable by semiconductor, including semiconductor laser light source, are useful.

Further, while discussed LED is referred to inorganic LED, it is apparent for those in this field to appreciate that it is replaceable with organic LED or any other radiation source.

The present invention provides a light emitting device comprising a semiconductor light source that emits light with wavelength at 250~500 nm; and a phosphor composition excitable by said light source, selected from the group consisting of $Mg_{14}Ge_{(5-a)}O_{24}:aMn^{4+}$, $SrGe_{(4-b)}O_9:bMn^{4+}$, $Mg_2Ti_{(1-c)}O_4:cMn^{4+}$, $Zn_2Ti_{(1-d)}O_4:dMn^{4+}$, $SrMgAl_{(10-e)}O_{17}:eMn^{4+}$, and $Y_3Ga_{(5-f)}O_{12}:fMn^{4+}$. Said semiconductor light source can be LED as well as organic LED. The present phosphor composition is coated on said LED used as light source to generate white light.

Based on that main body most suitable for $Mn^{4+}$ is six-coordinate and quantum efficiency of phosphor is elevated by $Mn^{4+}$, the present invention is achieved by preparing the phosphor composition according to:

1. $Mn^{4+}$ enters host lattice sites with similar radius;
2. Substitution site of the main body suitable for $Mn^{4+}$ is six-coordinated;
3. Excitation and emission of $Mn^{4+}$ are explainable by Tanabe-Sugano diagram for $d^3$ free ion, so that crystal field strength parameter (Dq) and Racah parameter (B) are estimated.
4. Cation with smaller atomic mass is used to form main body for $Mn^{4+}$ phosphor composition to improve quantum efficiency.

Following is the description for embodiments of the present invention, compositions 1-7. Instruments used in the present invention are: high temperature oven set, high temperature ventilation tubular oven, X-ray diffractometer (Bruker AXS D8), spectrofluorometer (Spex Fluorog-3; Jobin Yvon-Spex Instruments), color analyzer (DT-100 color analyzer; LAIKO), and UV-VIS spectrometer (U-3010; Hitachi), etc.

Preparation of Phosphor Composition (1) Preparation of $Mg_{14}Ge_5O_{24}:xMn^{4+}$ Phosphor Composition:

Stoichiometrically (x=0.15~2.5%) weighed MgO, $GeO_2$ and $MnO_2$ were uniformly mixed and milled for 30 minutes, then were put into aluminum oxide crucible to sinter at 1000~1300° C. for 8 hours. Related physical optic measurements, including analysis of X-ray diffraction on crystalline phase and structure, photoluminescence spectrum, C.I.E. chromaticity coordinate, etc., were conducted to sintered pale yellow powders.

(2) Preparation of $SrGe_4O_9:xMn^{4+}$ Phosphor Composition:

Stoichiometrically (x=0.15~2.5%) weighed $SrCO_3$, $GeO_2$ and $MnO_2$ were uniformly mixed and milled for 30 minutes, then were put into aluminum oxide crucible to sinter at 1000~1100° C. for 8 hours. Related physical optic measurements, including analysis of X-ray diffraction on crystalline phase and structure, photoluminescence spectrum, C.I.E. chromaticity coordinate, etc., were conducted to sintered pink powders.

(3) Preparation of $Mg_2TiO_4:xMn^{4+}$ Phosphor Composition:

Stoichiometrically (x=0.05~2%) weighed MgO, $TiO_2$ and $MnO_2$ were uniformly mixed and milled for 30 minutes, then were put into aluminum oxide crucible to sinter at 1300~1500° C. for 8 hours. Sintered powders were annealed by sintering at 570° C. for 16 hours in oven with flowing oxygen. Related physical optic measurements, including analysis of X-ray diffraction on crystalline phase and structure, photoluminescence spectrum, C.I.E. chromaticity coordinate, etc., were conducted to the resultant orange powders.

(4) Preparation of $Zn_2TiO_4:xMn^{4+}$ Phosphor Composition:

Stoichiometrically (x=0.05~2%) weighed ZnO, $TiO_2$ and $MnO_2$ were uniformly mixed and milled for 30 minutes, then were put into aluminum oxide crucible to sinter at 1200~1400° C. for 8 hours. Sintered powders were annealed by sintering at 570° C. for 16 hours in oven with flowing oxygen. Related physical optic measurements, including analysis of X-ray diffraction on crystalline phase and structure, photoluminescence spectrum, C.I.E. chromaticity coordinate, etc., were conducted to the resultant orange powders.

(5) Preparation of $SrMgAl_{10}O_{17}$:$xMn^{4+}$ Phosphor Composition:

Stoichiometrically (x=0.05~1.5%) weighed $SrCO_3$, MgO, $Al_2O_3$, and $MnO_2$ were uniformly mixed and milled for 30 minutes, then were put into aluminum oxide crucible to sinter at 1300~1600° C. for 8 hours. Related physical optic measurements, including analysis of X-ray diffraction on crystalline phase and structure, photoluminescence spectrum, C.I.E. chromaticity coordinate, etc., were conducted to sintered orange powders.

(6) Preparation of $Y_3Ga_5O_{12}$:$xMn^{4+}$ Phosphor Composition:

Stoichiometrically (x=0.05~1.5%) weighed $Y_2O_3$, $Ga_2O_3$ and $MnO_2$ were uniformly mixed and milled for 30 minutes, then were put into aluminum oxide crucible to sinter at 1000~1400° C. for 8 hours. Related physical optic measurements, including analysis of X-ray diffraction on crystalline phase and structure, photoluminescence spectrum, C.I.E. chromaticity coordinate, etc., were conducted to sintered pink powders.

Physical Optic Measurements of Phosphor Composition

Composition 1

(Physical Property of $Mg_{14}Ge_5O_{24}$:$Mn^{4+}$ Phosphor Composition)

Figure 2:
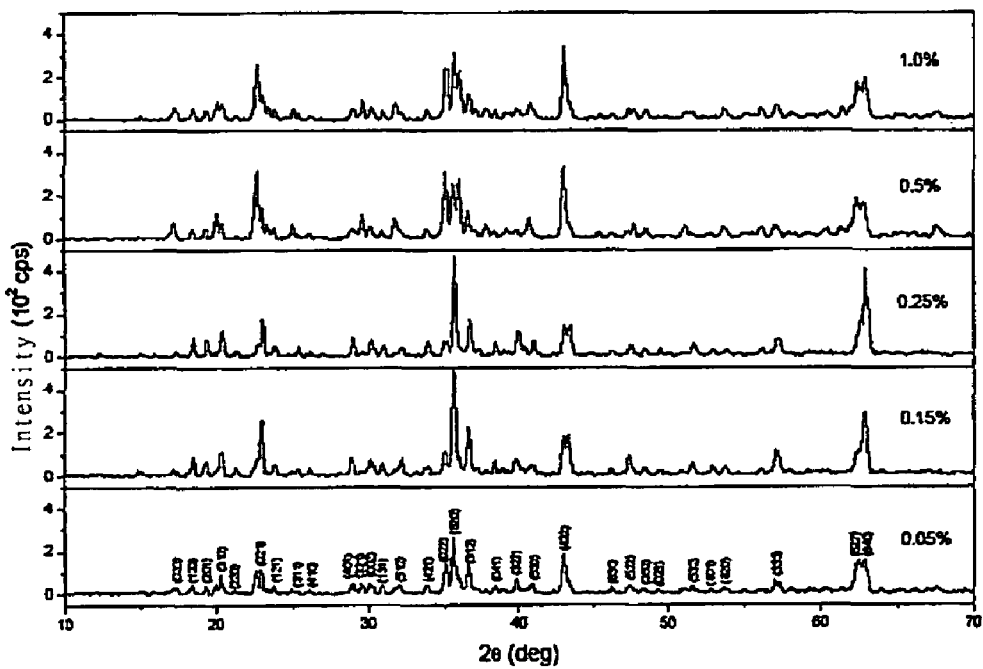
FIG. 2 shows comparison of XRD profiles from a series of $Mg_{14}Ge_5O_{24}$ phosphor composition samples doped with various concentrations of $Mn^{4+}$.

$Mg_{14}Ge_5O_{24}$:$Mn^{4+}$ phosphor composition was prepared by solid state synthesis. $Mg_{14}Ge_5O_{24}$:$Mn^{4+}$ phosphor composition of single phase with good crystallinity was obtained at synthesis temperature of 1200° C., while at synthesis temperature of 1100° C., starting materials MgO and $GeO_2$ were remained in sintered product and crystalline was not good. Also, at synthesis temperature of 1300° C., slight fusion occurred and reactants were vaporized. FIG. 1 shows $Mg_{14}Ge_5O_{24}$:$Mn^{4+}$ prepared at various sintering temperatures, in which crystallization phase obtained at 1200° C. was confirmed by comparison to be pure. FIG. 2 shows XRD spectra from a series of samples doped with various concentration of $Mn^{4+}$. It can be seen that X-ray diffraction spectra are similar at low dope concentrations; when dopant concentration is above 0.5 mol %, growth rate of crystallization phase with Miller index (520) is decreased, and growth of crystallization phase with (422) is preferred.

(Optical Property of $Mg_{14}Ge_5O_{24}$:$Mn^{4+}$ Phosphor Composition)

Figure 3:
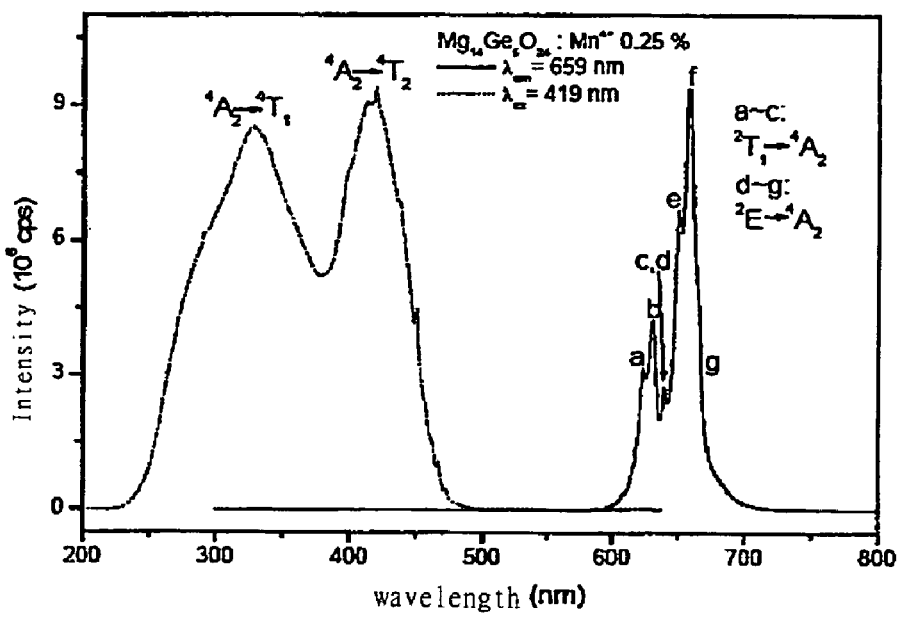
FIG. 3 shows excitation and photoluminescence spectra of $Mg_{14}Ge_5O_{24}$ phosphor composition synthesized at 1200° C.

FIG. 3 shows the photoluminescence spectra of $Mg_{14}Ge_5O_{24}$:$Mn^{4+}$ phosphor composition synthesized at 1200° C. In FIG. 3, dashed line represents excitation spectrum, wherein excitation wavelength at 327 and 419 nm are preferred, and that at 419 nm is more preferred. Solid line represents emission spectrum consisting of 6 narrow peaks, wherein emission intensity of peak at 659 nm in red area is highest, and both excitation and emission wavelengths are not affected by doped amount of $Mn^{4+}$. Therefore, in the process of excitation to emission, $Mg_{14}Ge_5O_{24}$:$Mn^{4+}$ phosphor composition is excited as $^4A_2 \rightarrow ^4T_1$ and $^4A_2 \rightarrow ^4T_2$, and emits as $^2E \rightarrow ^4A_2$, wherein the lowest excited state of energy levels in crystalline field is $^2E$, and ground state is $^4A_2$. Generally, phosphor composition is excited to $^4T_1$ and $^4T_2$, and then relaxes to $^2E$ to produce $^2E \rightarrow ^4A_2$ emission.

Figure 4:
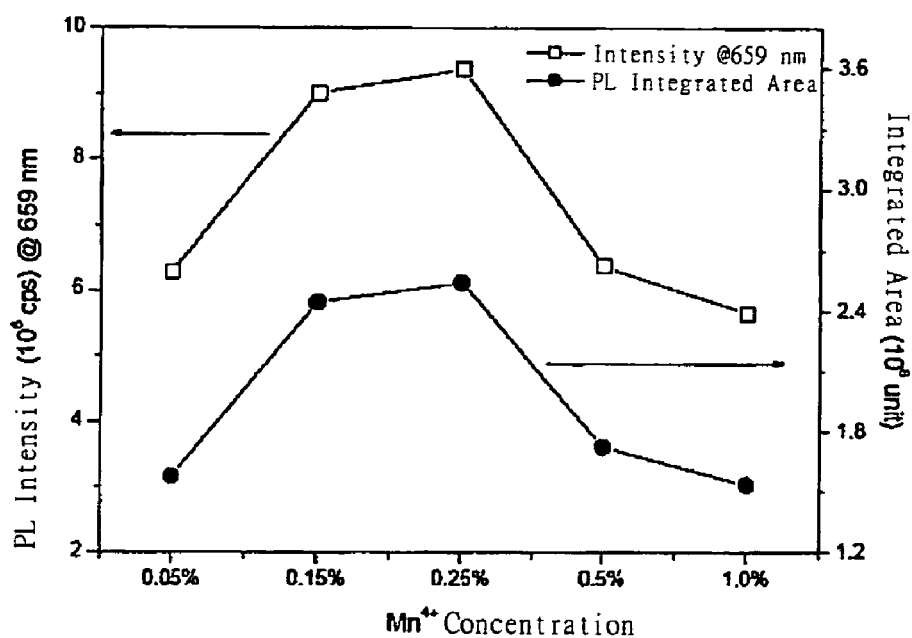
FIG. 4 shows concentration effect of $Mg_{14}Ge_5O_{24}:Mn^{4+}$ phosphor composition.

FIG. 4 shows the concentration effect of $Mg_{14}Ge_5O_{24}$:$Mn^{4+}$ phosphor composition doped with various concentrations of $Mn^{4+}$. As can be seen, intensity of luminescence increases as doped amount of $Mn^{4+}$ is increased, and is highest at 0.25 mol %. While doped amount of $Mn^{4+}$ is above 0.5 mol %, concentration quenching occurs due to $Mn^{4+}$ concentration is too high, so that emitting intensity decreases. Variation of integrated area of emission spectrum according to $Mn^{4+}$ concentration is identical with that of intensity of emission spectrum.

Figure 5:
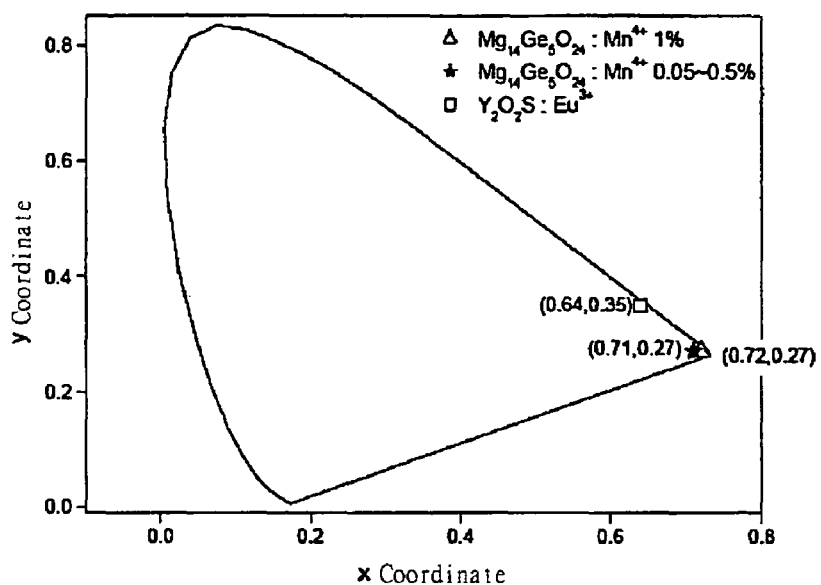
FIG. 5 shows chromaticity coordinates of $Mg_{14}Ge_5O_{24}:Mn^{4+}$ phosphor composition.

FIG. 5 shows the C.I.E. chromaticity coordinate of $Mg_{14}Ge_5O_{24}$:$Mn^{4+}$ phosphor composition. As can be seen, a series of $Mg_{14}Ge_5O_{24}$ samples are excited with 419 nm, wherein chromaticity coordinate value of sample doped with 0.05~0.5 mol % of $Mn^{4+}$, represented by '*', is (0.71, 0.27), and that doped with 1 mol %, represented by 'Δ', is (0.72, 0.27); both are much better than current commercial product $Y_2O_2S$:$Eu^{3+}$ (0.64, 0.35). However, chromaticity coordinate shifts to right as emission intensity decreases, and shows extensive red emission when seen by naked eye. According to photoluminescence wavelength of 652 nm, it is reasonable to obtain such high color saturation. Table 1 shows comparison of chromaticity coordinate values of $Mg_{14}Ge_5O_{24}$:$Mn^{4+}$ phosphor compositions doped with various concentration of $Mn^{4+}$.

TABLE 1

| $Mn^{4+}$ mol % | x ordinate value | y ordinate value |
|---|---|---|
| 0.05 | 0.72 | 0.27 |
| 0.15 | 0.72 | 0.27 |
| 0.25 | 0.72 | 0.27 |
| 0.5 | 0.72 | 0.27 |
| 1.0 | 0.71 | 0.27 |

Composition 2

(Physical Property of $SrGe_4O_9$:$Mn^{4+}$ Phosphor Composition)

Figure 6:
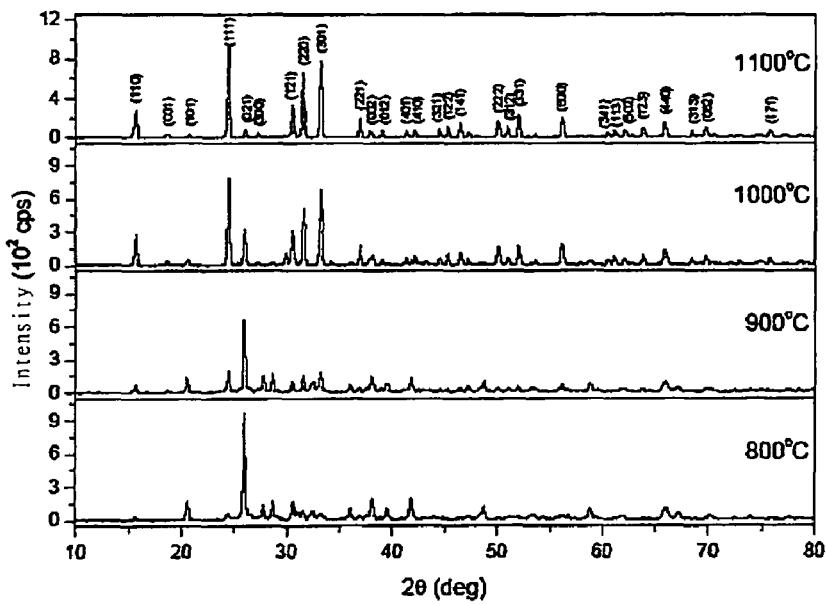
FIG. 6 shows comparison of XRD profiles from $SrGe_4O_9:xMn^{4+}$ phosphor compositions synthesized at various sintering temperatures.
Figure 7A:
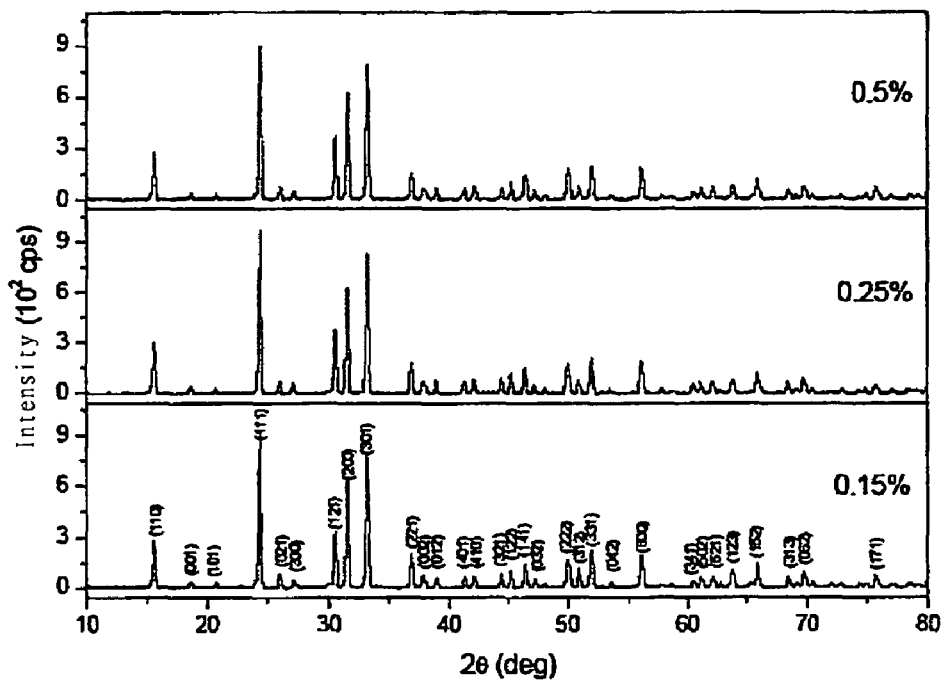
FIG. 7A shows comparison of XRD profiles from a series of $SrGe_4O_9:xMn^{4+}$ phosphor composition samples doped with various concentrations of $Mn^{4+}$.
Figure 7B:
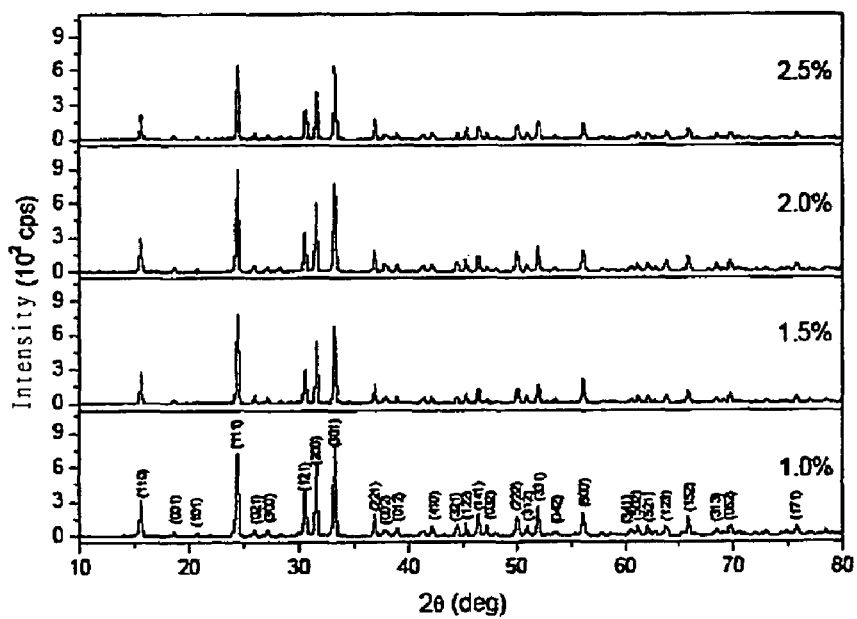
FIG. 7B shows comparison of XRD profiles from a series of $SrGe_4O_9:xMn^{4+}$ phosphor composition samples doped with various concentrations of $Mn^{4+}$.

$SrGe_4O_9$:$xMn^{4+}$ phosphor composition was prepared by solid state synthesis. No single phase appeared at initial sintering temperature of 900° C., and parent $SrGe_4O_9$ was found at 1000° C. but crystallinity was not good. Fused state product was found at 1200° C. FIG. 6 shows samples synthesized at various sintering temperatures. As can been, until temperature was elevated up to 1100° C., $SrGe_4O_9$:$xMn^{4+}$ phosphor composition of single phase with good crystallinity was obtained FIGS. 7A and 7B show the XRD profiles from a series of $SrGe_4O_9$:$Mn^{4+}$ samples doped with various concentration of $Mn^{4+}$. Structure of $SrGe_4O_9$ was not affected by $Mn^{4+}$ in dopant concentration ranging from 0.15 to 2.5 mol %.

(Optical Property of $SrGe_4O_9$:$Mn^{4+}$ Phosphor Composition)

Figure 8:
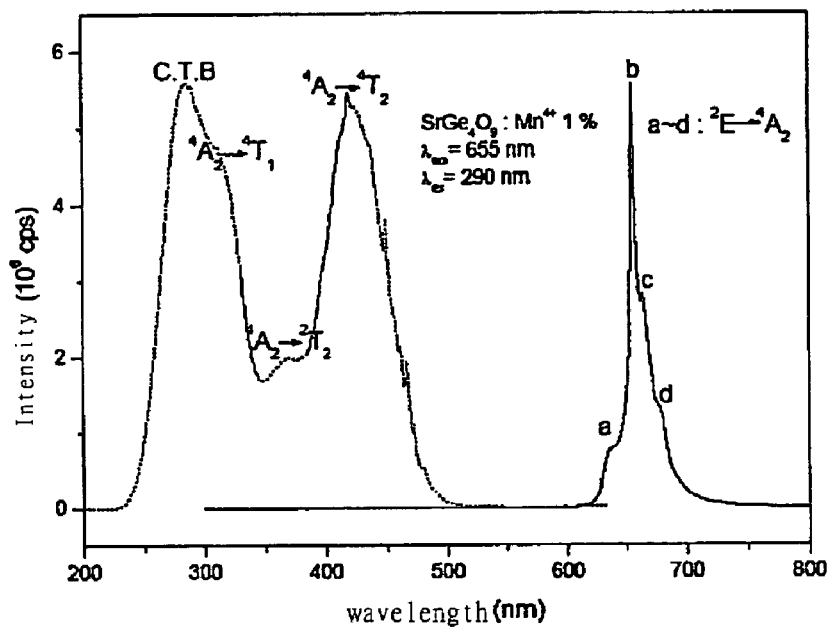
FIG. 8 shows excitation and photoluminescence spectra of $SrGe_4O_9:xMn^{4+}$ phosphor composition synthesized at 1100° C.

FIG. 8 shows the photoluminescence spectra of $SrGe_4O_9$:$Mn^{4+}$ phosphor composition synthesized at 1200° C. Dashed line at left hand represents excitation spectrum, wherein excitation wavelength at 329 nm originating from transfer band of $O_2$_P→$Mn^{4+}$3d is preferred. Small peak at 312 nm approximating to said band may originate from $^4A_2 \rightarrow ^4T_1$, and those at 325 and 419 nm originate from $^4A_2 \rightarrow ^2T$ and $^4A_2 {}^4T_2$, respectively. Since $^4A_2 \rightarrow ^2T_1$ is spin-forbidden, it shows weaker intensity compared to $^4A_2 \rightarrow ^4T_1$ and $^4A_2 \rightarrow ^4T_2$. Solid line represents linear peaks appearing in 620~700 nm, similar to those from $SrGe_4O_9$:$Mn^{4+}$, in which emission peak at 655 nm originates from $^2E \rightarrow ^4A_2$.

Figure 9:
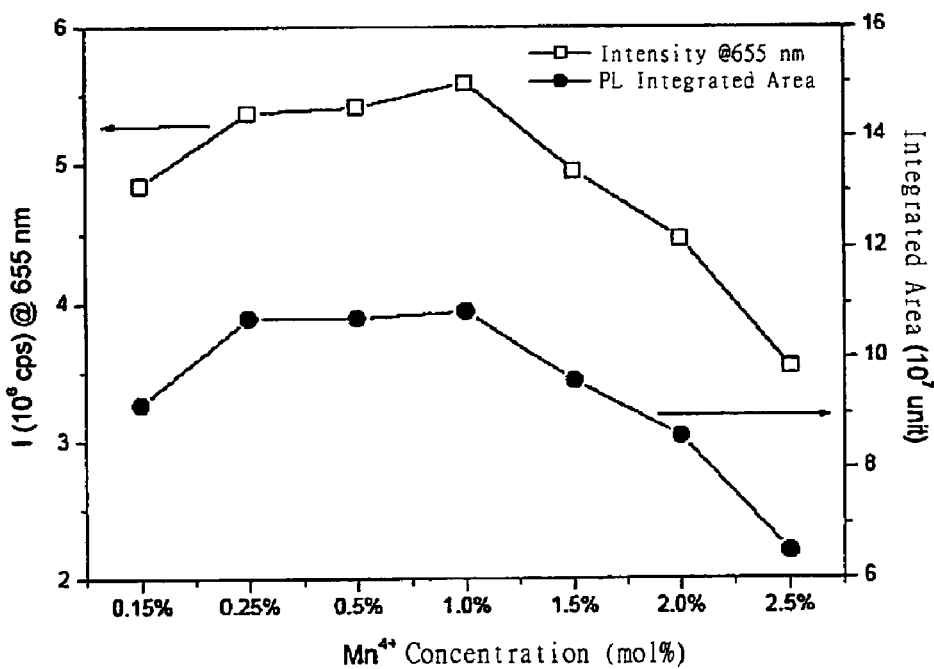
FIG. 9 shows concentration effect of $SrGe_4O_9:xMn^{4+}$ phosphor composition doped with various concentrations of $Mn^{4+}$.

FIG. 9 shows the concentration effect of $SrGe_4O_9$:$Mn^{4+}$ phosphor composition doped with various concentrations of $Mn^{4+}$. As can be seen, intensity of luminescence is highest at dopant concentration of 1 mol %. While dopant concentration is above 1 mol %, concentration quenching occurs due to excess energy transfer, so that intensity of luminescence decreases. Further, both maximum integrated area of emission spectrum and brightness appear at 1 mol %.

Figure 10:
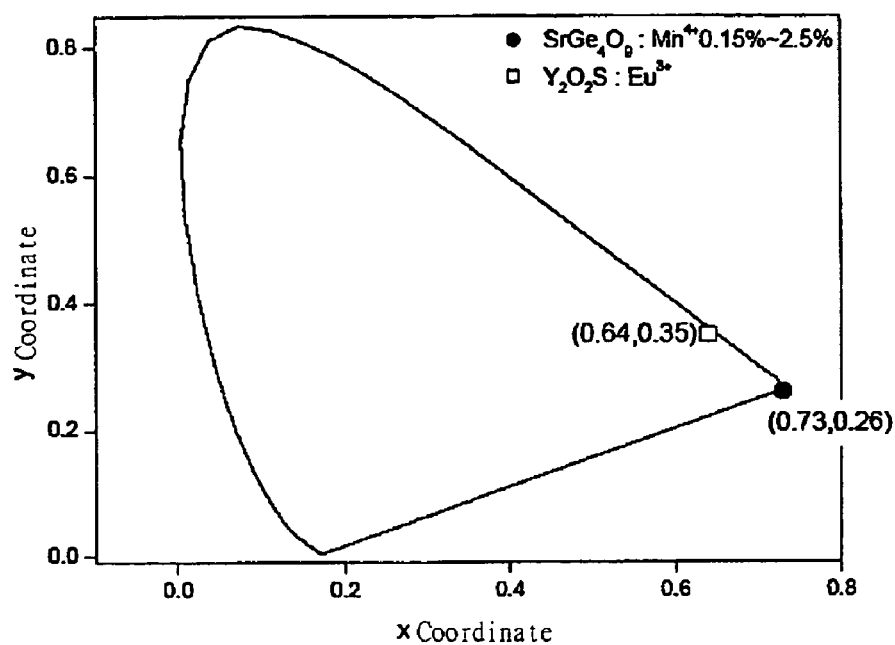
FIG. 10 shows C.I.E. chromaticity coordinates of $SrGe_4O_9:Mn^{4+}$ phosphor composition.

FIG. 10 shows the C.I.E. chromaticity coordinate of $SrGe_4O_9:Mn^{4+}$ phosphor composition. As can be seen, a series of $SrGe_4O_9$ samples are excited with 419 nm. Coordinate value of black dot is (0.73, 0.26). Chromaticity coordinate value is not affected in dopant concentration ranging from 0.15 to 2.5 mol %, and color saturation is much better than current commercial product $Y_2O_2S:Eu^{3+}$ (0.64, 0.35).

Table 2 shows comparison of chromaticity coordinate values of $SrGe_4O_9:Mn^{4+}$ phosphor compositions doped with various concentrations of $Mn^{4+}$.

TABLE 2

| $Mn^{4+}$ mol % | x ordinate value | y ordinate value |
| --- | --- | --- |
| 0.15 | 0.73 | 0.26 |
| 0.25 | 0.73 | 0.26 |
| 0.5 | 0.73 | 0.26 |
| 1.0 | 0.73 | 0.26 |
| 1.5 | 0.73 | 0.26 |
| 2.0 | 0-73 | 0.26 |
| 2.5 | 0.73 | 0.26 |

Composition 3

(Physical Property of $Mg_2TiO_4:Mn^{4+}$ Phosphor Composition)

Figure 11:
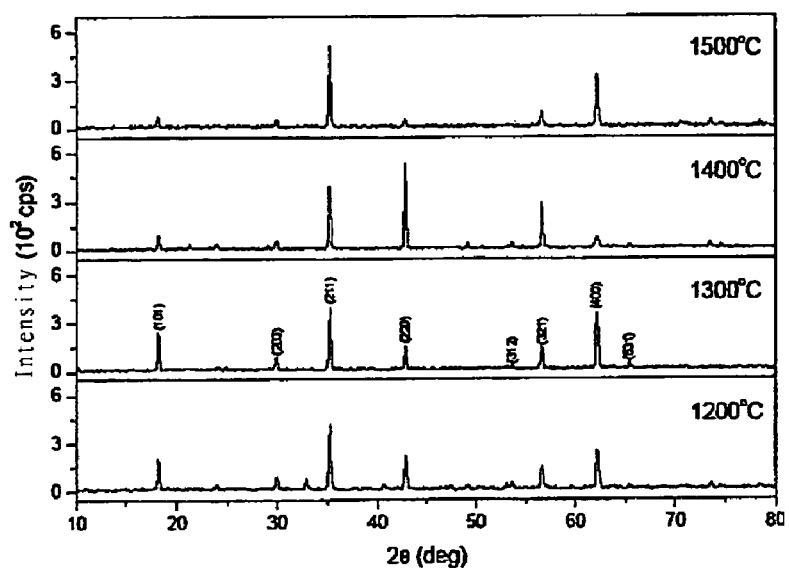
FIG. 11 shows comparison of XRD profiles from $Mg_2TiO_4:Mn^{4+}$ phosphor compositions synthesized at various temperatures.

FIG. 11 shows comparison of XRD profiles from $Mg_2TiO_4:Mn^{4+}$ phosphor compositions synthesized at various temperatures. $Mg_2TiO_4:Mn^{4+}$ phosphor composition was successfully synthesized at as high as 1300° C. Though crystallinity of products obtained at 1400 and 1500° C. was higher, data from Inorganic Crystal Structure Database (ICSD) confirmed intensity ratio among various diffraction peaks is close to that obtained at 1300° C., thus preferred synthesis temperature is 1300° C.

Figure 12A:
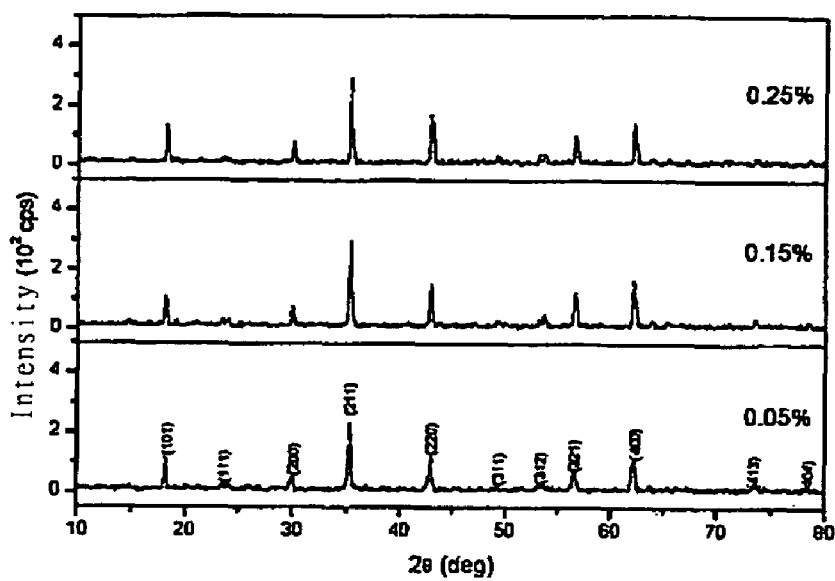
FIG. 12A shows comparison of XRD profiles from a series of $Mg_2TiO_4:Mn^{4+}$ phosphor composition samples doped with various concentrations of $Mn^{4+}$.
Figure 12B:
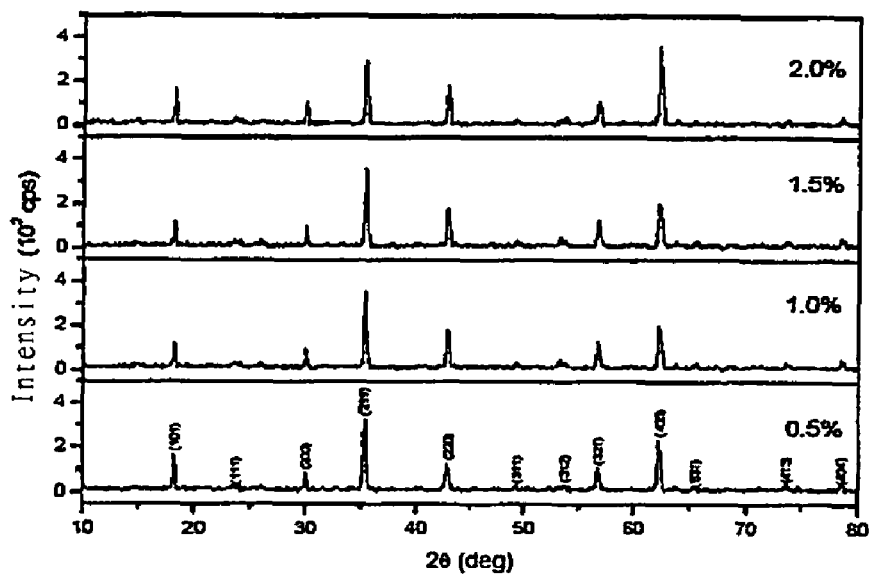
FIG. 12B shows comparison of XRD profiles from a series of $Mg_2TiO_4:Mn^{4+}$ phosphor composition samples doped with various concentrations of $Mn^{4+}$.

FIGS. 12A and 12B show the XRD profiles from a series of $Mg_2TiO_4:Mn^{4+}$ samples doped with various concentrations of $Mn^{4+}$. Structure of $Mg_2TiO_4:Mn^{4+}$ was not affected by $Mn^{4+}$ in dopant concentration ranging from 0.05 to 2 mol %.

(Optical Property of $Mg_2TiO_4:Mn^{4+}$ Phosphor Composition)

Figure 13:
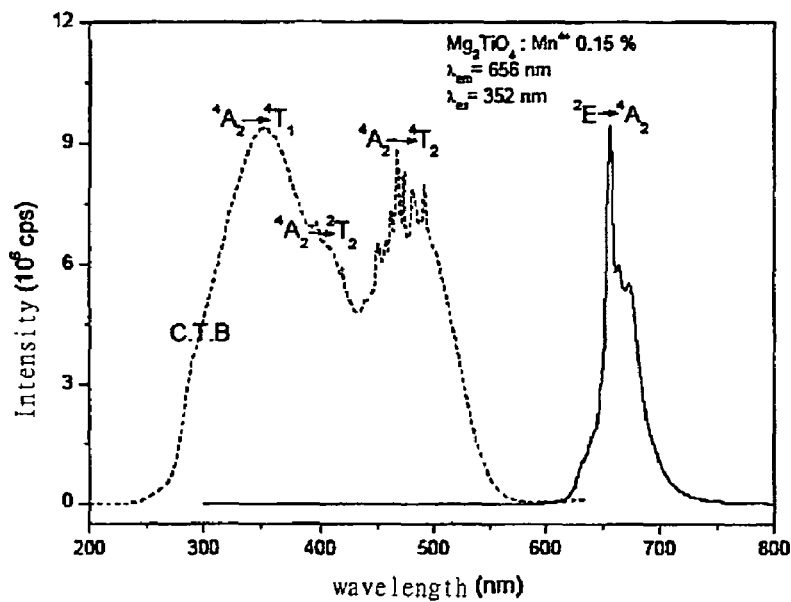
FIG. 13 shows excitation and photoluminescence spectra of $Mg_2TiO_4:Mn^{4+}$ phosphor synthesized at 1300° C.

FIG. 13 shows the photoluminescence spectra of $Mg_2TiO_4:Mn^{4+}$ phosphor composition synthesized at 1300° C. In dashed line part, small peak at 300 nm originates from charge transfer band of $O_2-2p \rightarrow Mn^{4+}3d$, and those at 352, 400 and 478 nm correspond to $^4A_2 \rightarrow ^4T_1$, $^4A_2 \rightarrow ^4T_1$ and $^4A_2 \rightarrow ^4T_2$, respectively. Since $^4A_2 \rightarrow ^2T_2$ is spin-forbidden, it shows weaker intensity. Solid line at right hand represents emission spectrum mainly originating from $^2E \rightarrow ^4A_2$.

Figure 14:
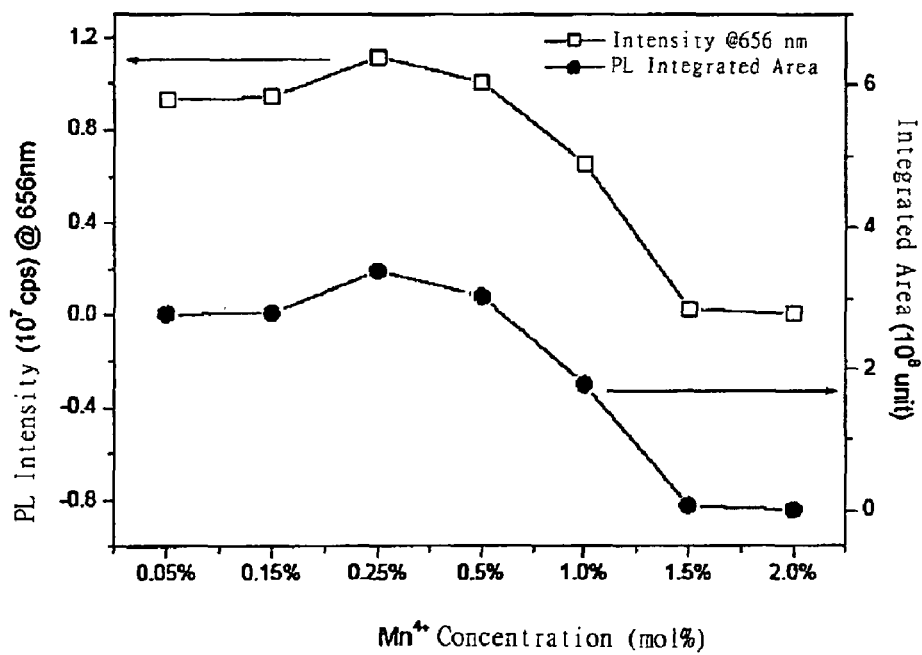
FIG. 14 shows concentration effect of $Mg_2TiO_4:Mn^{4+}$ phosphor composition doped with various concentrations of $Mn^{4+}$.

FIG. 14 shows the concentration effect of $Mg_2TiO_4:Mn^{4+}$ phosphor composition doped with various concentrations of $Mn^{4+}$. Both intensity and integrated area of emission spectrum are highest at 0.25 mol %, but smooth at low concentration. Concentration quenching is found at concentration above 1 mol %.

Figure 15:
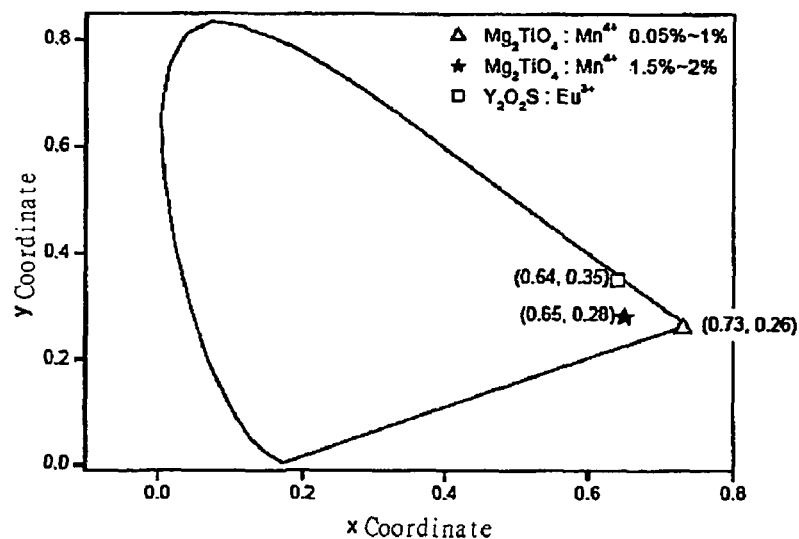
FIG. 15 shows C.I.E. chromaticity coordinates of $Mg_2TiO_4:Mn^{4+}$ phosphor composition.

FIG. 15 shows the C.I.E. chromaticity coordinates of $Mg_2TiO_4:Mn^{4+}$ phosphor composition. As can be seen, 'Δ' represents chromaticity coordinate value of sample doped with 0.05~1.0 mol % of $Mn^{4+}$, (0.73, 0.26), which is nearly saturated; whereas '*' represents that of doped with 1.5~2.0 mol %. Similarly, chromaticity coordinate value of $Mg_2TiO_4:Mn^{4+}$ phosphor composition doped with 0.05~1.0 mol % is better than current commercial product $Y_2O_2S:Eu^{3+}$ (0.64, 0.35).

Table 3 shows the comparison of chromaticity coordinate values of $Mg_2TiO_4:Mn^{4+}$ phosphor compositions doped with various concentration of $Mn^{4+}$.

TABLE 3

| $Mn^{4+}$ mol % | x ordinate value | y ordinate value |
| --- | --- | --- |
| 0.05 | 0.73 | 0.26 |
| 0.15 | 0.73 | 0.26 |
| 0.25 | 0.73 | 0.26 |
| 0.5 | 0.73 | 0.26 |
| 1.0 | 0.73 | 0.26 |
| 1.5 | 0.65 | 0.28 |
| 2.0 | 0.65 | 0.28 |

Composition 4

(Physical Property of $Zn_2TiO_4:Mn^{4+}$ Phosphor Composition)

Figure 16:
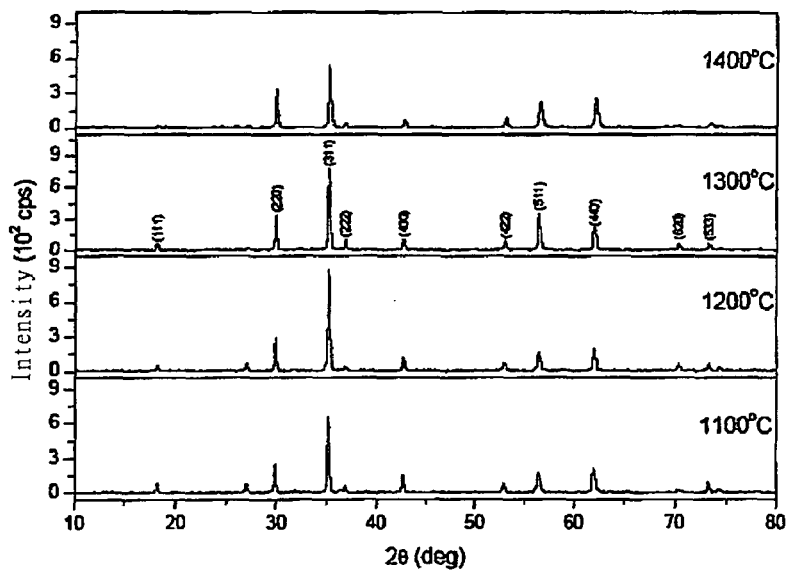
FIG. 16 shows comparison of XRD profiles from $Zn_2TiO_4:Mn^{4+}$ phosphor compositions synthesized at various temperatures.
Figure 17A:
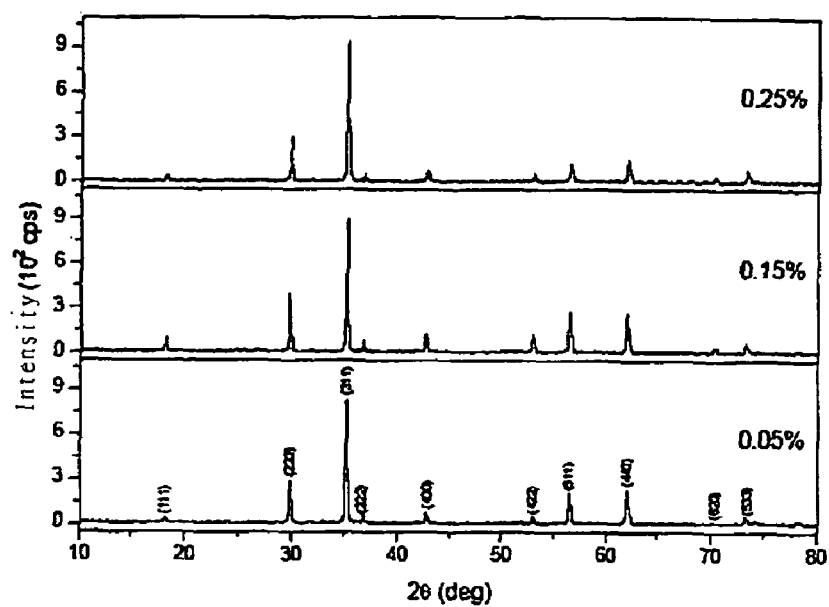
FIG. 17A shows comparison of XRD spectra from a series of $Zn_2TiO_4:Mn^{4+}$ phosphor composition samples doped with various concentrations of $Mn^{4+}$.
Figure 17B:
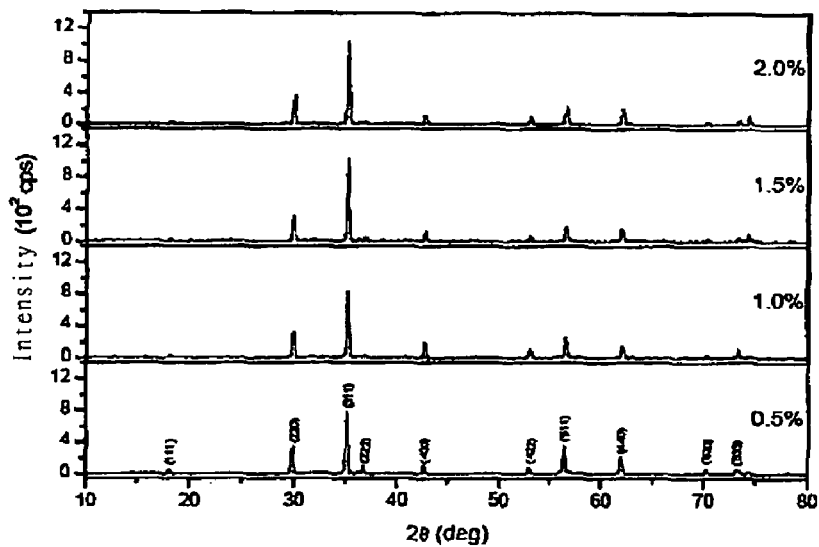
FIG. 17B shows comparison of XRD profiles from a series of $Zn_2TiO_4:Mn^{4+}$ phosphor composition samples doped with various concentrations of $Mn^{4+}$.

Structure of $Zn_2TiO_4:Mn^{4+}$ is the same as that of above $Mg_2TiO_4:Mn^{4+}$. FIG. 16 shows the comparison of XRD profiles from $Zn_2TiO_4:Mn^{4+}$ phosphor compositions synthesized at various temperatures. Though $Zn_2TiO_4:Mn^{4+}$ phosphor composition can be synthesized at about 1200° C., those obtained at 1300° C. is of best crystallinity and purity. Crystallinity of product obtained at 1400° C. is lower. Further, FIGS. 17A and 17B show XRD spectra from a series of $Zn_2TiO_4:Mn^{4+}$ samples doped with various concentrations of $Mn^{4+}$. Structure of $Zn_2TiO_4:Mn^{4+}$ is not affected by $Mn^{4+}$ in dopant concentration ranging from 0.05 to 2 mol %.

(Optical Property of $Zn_2TiO_4:Mn^{4+}$ Phosphor Composition)

Figure 18:
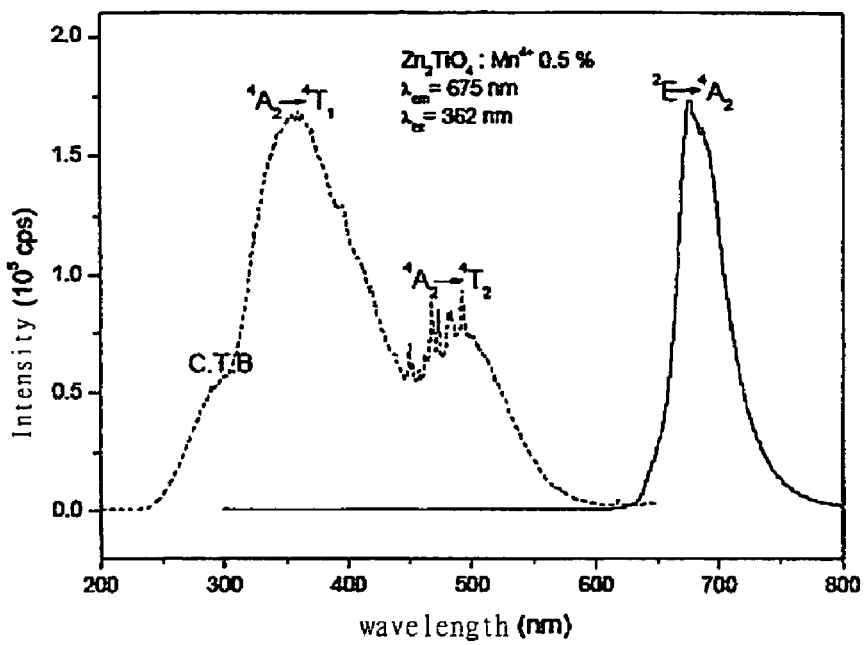
FIG. 18 shows excitation and photoluminescence spectra of $Zn_2TiO_4:Mn^{4+}$ phosphor composition synthesized at 1300° C.

FIG. 18 shows the photoluminescence spectra of $Zn_2TiO_4:Mn^{4+}$ phosphor composition synthesized at 1300° C. Dashed line at left hand represents excitation spectrum, wherein peak at 300 nm originates from charge transfer band of $O^{2-}2P \rightarrow Mn^{4+}3d$, and those at 362 and 486 nm correspond to $^4A_2 \rightarrow ^4T_1$ and $^4A_2 \rightarrow ^4T_2$, respectively. Solid line at right hand represents emission spectrum, wherein emission intensity at 672 nm in red area is highest.

Figure 19:
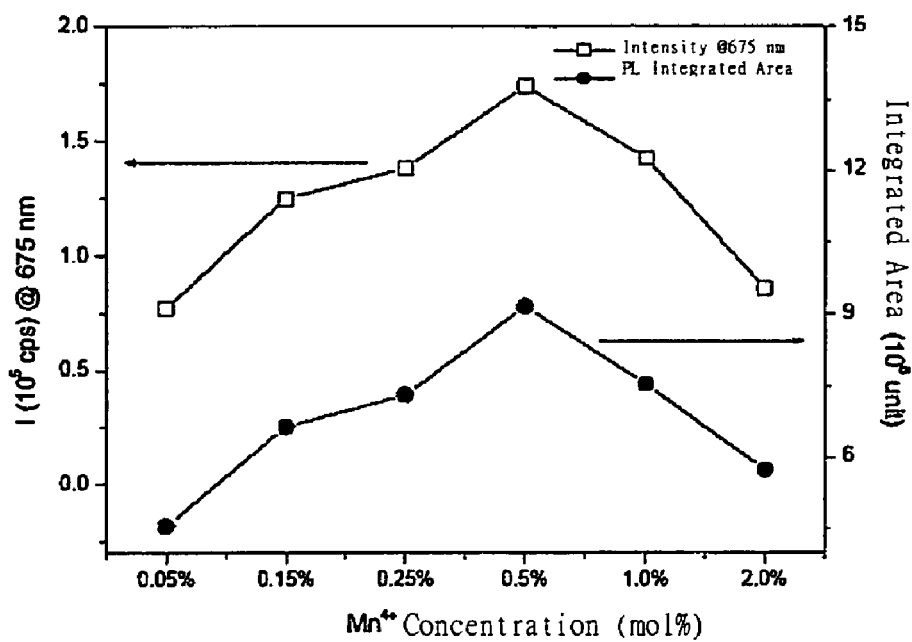
FIG. 19 shows concentration effect of $Zn_2TiO_4:Mn^{4+}$ phosphor composition doped with various concentrations of $Mn^{4+}$.

FIG. 19 shows the concentration effect of $Zn_2TiO_4:Mn^{4+}$ phosphor composition doped with various concentrations of $Mn^{4+}$. Intensity of luminescence spectrum increases as dopant concentration is increased, reaches highest at 0.5 mol % and then drops down.

Figure 20:
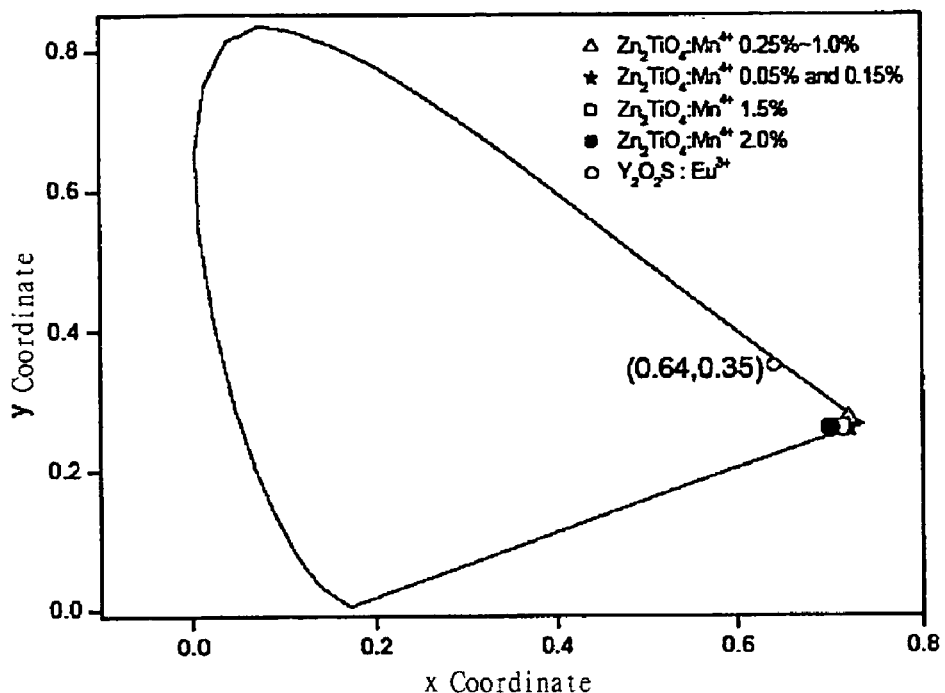
FIG. 20 shows C.I.E. chromaticity coordinates of $Zn_2TiO_4:Mn^{4+}$ phosphor composition.
Figure 21:
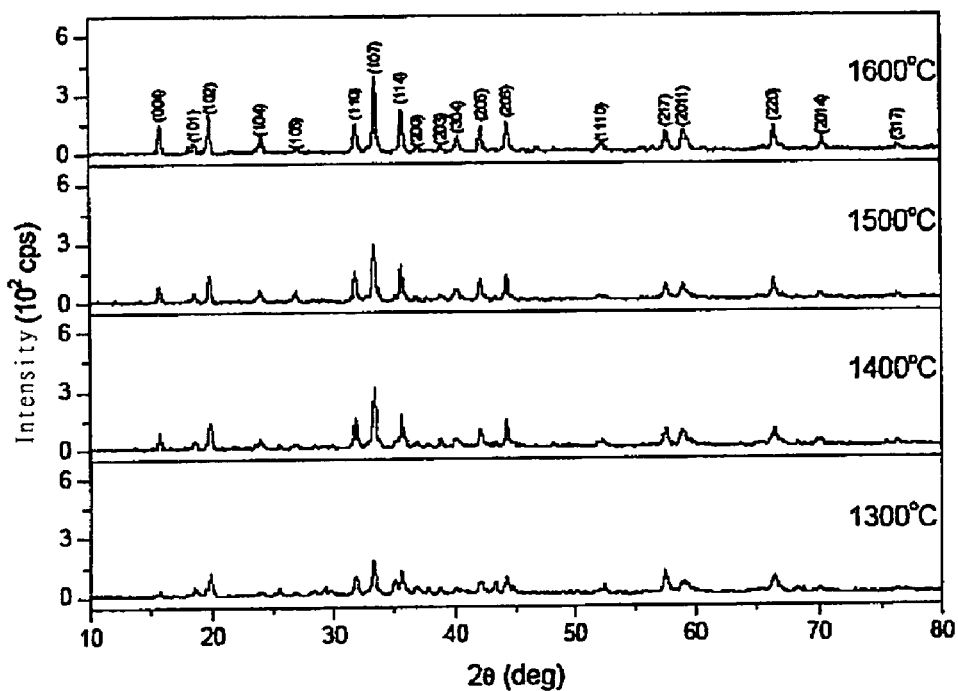
FIG. 21 shows comparison of XRD profiles from $SrMgAl_{10}O_{17}:Mn^{4+}$ phosphor compositions synthesized at various sintering temperatures.

FIG. 20 shows the C.I.E. chromaticity coordinates of $Zn_2TiO_4:Mn^{4+}$ phosphor composition. As can be seen, 'Δ' represents chromaticity coordinate value of sample doped with 0.25~1.0 mol % of $Mn^{4+}$, '*' represents that of doped with 0.05~0.15 mol %, '□' represents that of doped with 1.5 mol %, and '●' represents that of doped with 2.0 mol %. The best $Zn_2TiO_4:Mn^{4+}$ phosphor composition is obtained when doped with 0.25~1.0 mol % of $Mn^{4+}$. Chromaticity coordinate value decreases when shifting to left, and composition becomes less saturated. Also, 'o' represents chromaticity coordinate value of current commercial product $Y_2O_2S:Eu^{3+}$.

Table 4 shows the comparison of chromaticity coordinate values of $Zn_2TiO_4:Mn^{4+}$ phosphor compositions doped with various concentrations of $Mn^{4+}$.

TABLE 4

| $Mn^{4+}$ mol % | x ordinate value | y ordinate value |
| --- | --- | --- |
| 0.05 | 0.72 | 0.26 |
| 0.15 | 0.72 | 0.26 |
| 0.25 | 0.72 | 0.27 |

TABLE 4-continued

| $Mn^{4+}$ mol % | x ordinate value | y ordinate value |
|---|---|---|
| 0.5 | 0.72 | 0.27 |
| 1.0 | 0.72 | 0.27 |
| 1.5 | 0.71 | 0.26 |
| 2.0 | 0.7 | 0.26 |

Composition 5

(Physical Property of $SrMgAl_{10}O_{17}:Mn^{4+}$ Phosphor Composition)

As can be seen in FIG. 16, the best synthetic temperature for $SrMgAl_{10}O_{17}:Mn^{4+}$ phosphor composition is 1600° C., though $SrMgAl_{10}O_{17}:Mn^{4+}$ crystallization phase forms starting at 1300° C. In according with the theory that crystallinity of phosphor composition is proportional to intensity, although the best synthetic temperature for $SrMgAl_{10}O_{17}:Mn^{4+}$ phosphor composition is above 1700° C. in prior document (N. Iyi and M. Gobbels, J. Solid State Chem., 122, 46, 1996), it can only be reached at 1600° C. in the present invention due to limitation of power of used high temperature oven.

Figure 22A:
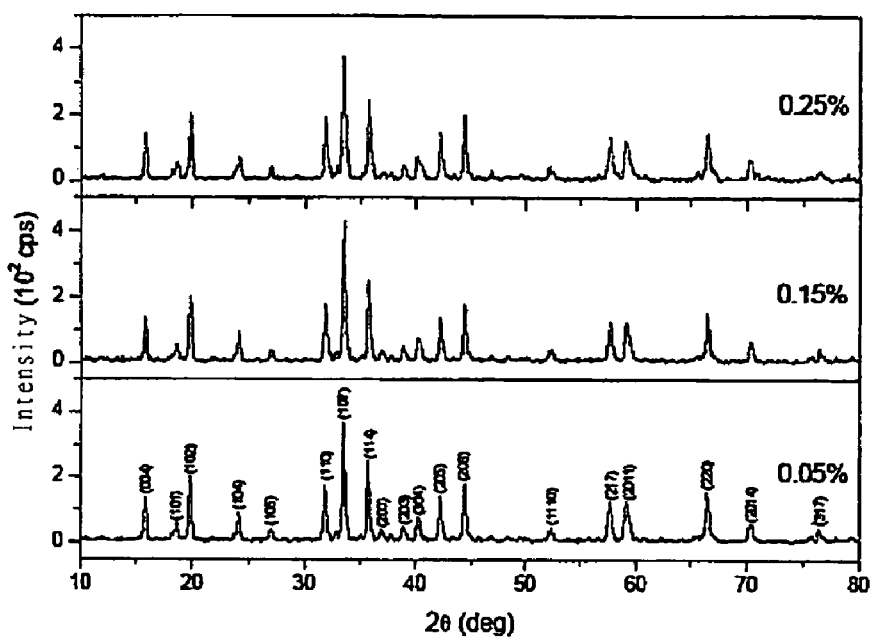
FIG. 22A shows comparison of XRD spectra from a series of $SrMgAl_{10}O_{17}:Mn^{4+}$ phosphor composition samples doped with various concentrations of $Mn^{4+}$.
Figure 22B:
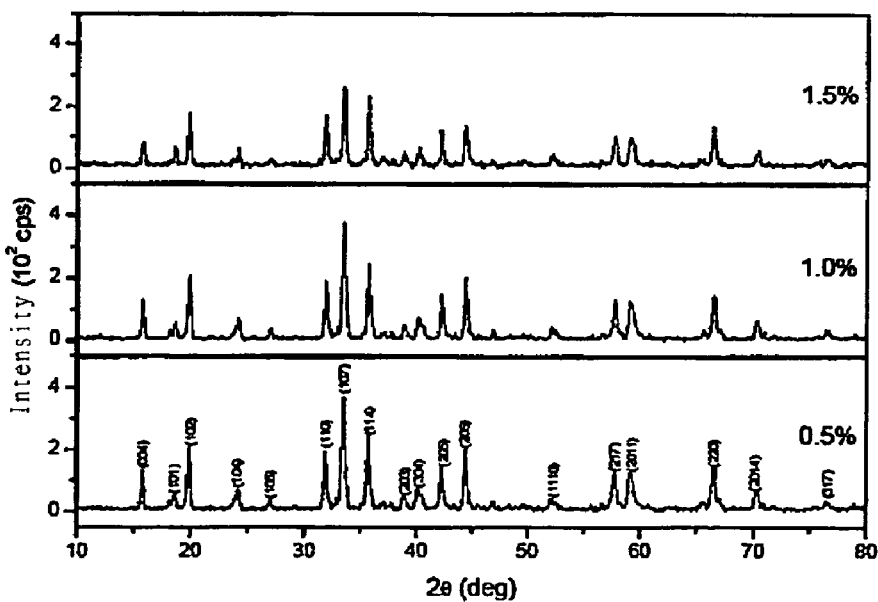
FIG. 22B shows comparison of XRD profiles from a series of $SrMgAl_{10}O_{17}:Mn^{4+}$ phosphor composition samples doped with various concentrations of $Mn^{4+}$.

FIGS. 22A and 22B show the XRD profiles from a series of $SrMgAl_{10}O_{17}:Mn^{4+}$ samples doped with various concentration of $Mn^{4+}$. Crystallinity is affected by $Mn^{4+}$ in dopant concentration above 1.5 mol %.

(Optical Property of $SrMgAl_{10}O_{17}:Mn^{4+}$ Phosphor Composition)

Figure 23:
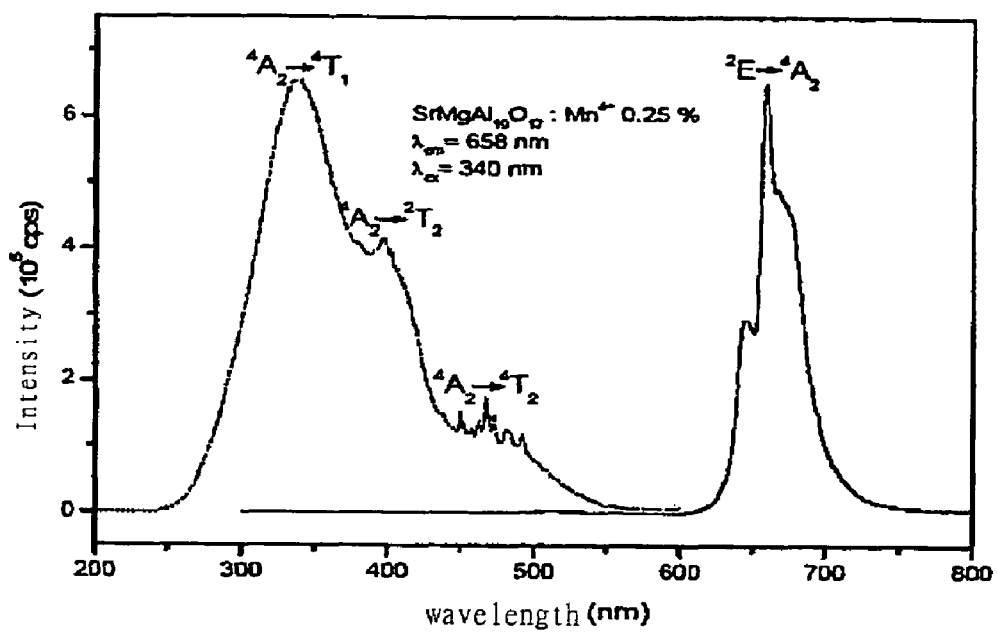
FIG. 23 shows excitation and photoluminescence spectra of $SrMgAl_{10}O_{17}:Mn^{4+}$ phosphor composition.

FIG. 23 shows the photoluminescence spectra of $SrMgAl_{10}O_{17}:Mn^{4+}$ phosphor. Dashed line at left hand represents excitation spectrum, wherein absorption peak at 340 nm originates from $^4A_2 \rightarrow {}^4T_1$, and small peaks at 396 and 468 nm correspond to $^4A_2 \rightarrow {}^2T_2$ and $^4A_2 \rightarrow {}^4T_2$, respectively. Solid line at right hand represents emission spectrum, wherein peak at 658 nm originates from red emission of $2E \rightarrow {}^4A_2$.

Figure 24:
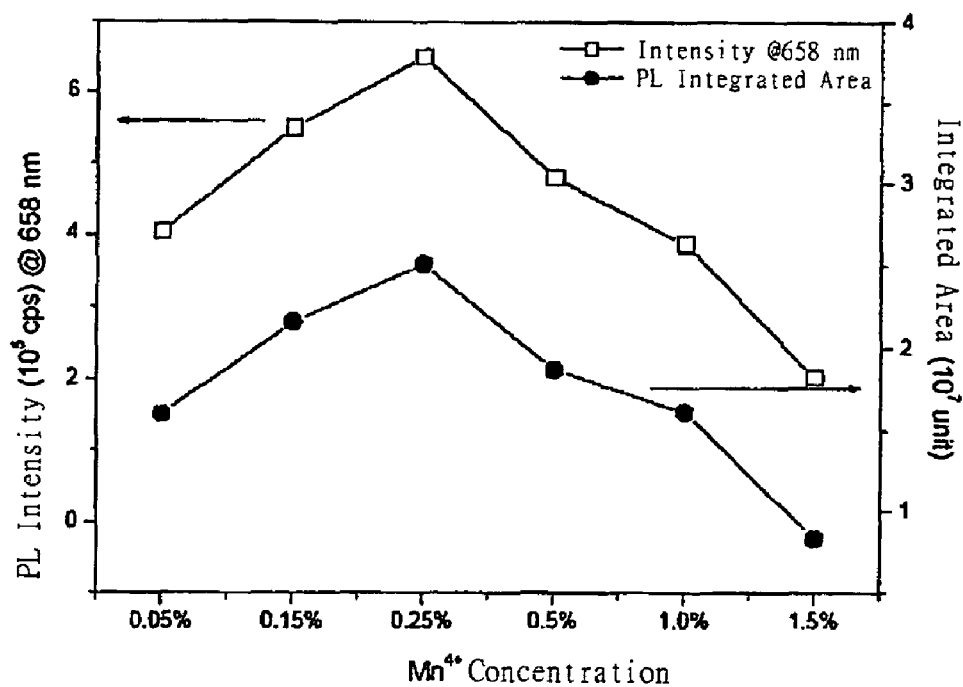
FIG. 24 shows concentration effect of $SrMgAl_{10}O_{17}:Mn^{4+}$ phosphor composition doped with various concentrations of $Mn^{4+}$.

FIG. 24 shows the comparison of emission intensity of $SrMgAl_{10}O_{17}:Mn^{4+}$ phosphor composition doped with various concentration of $Mn^{4+}$. Both intensity and integrated area of peak at 658 nm are highest at 0.25 mol %.

Figure 25:
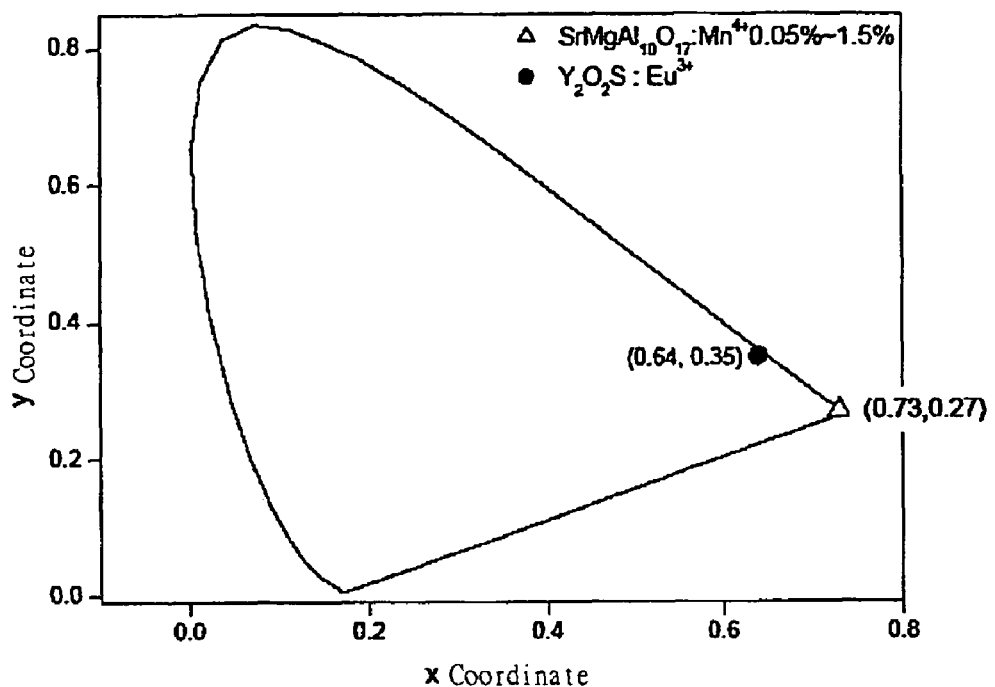
FIG. 25 shows C.I.E. chromaticity coordinates of $SrMgAl_{10}O_{17}:Mn^{4+}$ phosphor composition.

FIG. 25 shows C.I.E. chromaticity coordinates of $SrMgAl_{10}O_{17}:Mn^{4+}$ phosphor composition. As can be seen, 'Δ' represents chromaticity coordinate value of red emission wavelength at 658 nm from $SrMgAl_{10}O_{17}:Mn^{4+}$ phosphor composition excited by 340 nm, (0.73, 0.27), which is saturated. Table 5 shows comparison of chromaticity coordinate values of $SrMgAl_{10}O_{17}:Mn^{4+}$ phosphor compositions doped with various concentrations of $Mn^{4+}$; chromaticity coordinate value is not affected in dopant concentration of 0.05~1.5 mol %.

TABLE 5

| $Mn^{4+}$ mol % | x ordinate value | y ordinate value |
|---|---|---|
| 0.05 | 0.73 | 0.27 |
| 0.15 | 0.73 | 0.27 |
| 0.25 | 0.73 | 0.27 |
| 0.5 | 0.73 | 0.27 |
| 1.0 | 0.73 | 0.27 |
| 1.5 | 0.73 | 0.27 |

Composition 6

(Physical Property of $Y_3Ga_5O_{12}:Mn^{4+}$ Phosphor Composition)

Figure 26:
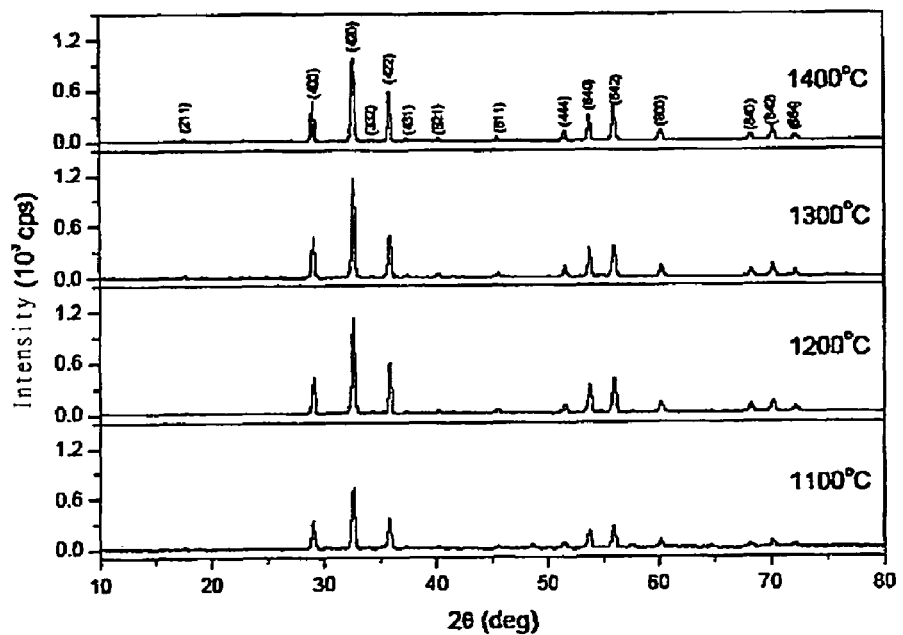
FIG. 26 shows comparison of XRD profiles from $Y_3Ga_5O_{12}:Mn^{4+}$ phosphor compositions synthesized at various temperatures.

$Y_3Ga_5O_{12}:Mn^{4+}$ phosphor composition is prepared by solid state synthesis. As can be seen in FIG. 26, $Y_3Ga_5O_{12}$ crystalline phase forms as synthetic temperature reaches 1100° C.; best crystallinity is obtained at 1400° C.; and fused glassy product is obtained at 1500° C. Therefore, the best synthetic temperature for the present $Y_3Ga_5O_{12}:Mn^{4+}$ phosphor composition is 1400° C.

Figure 27A:
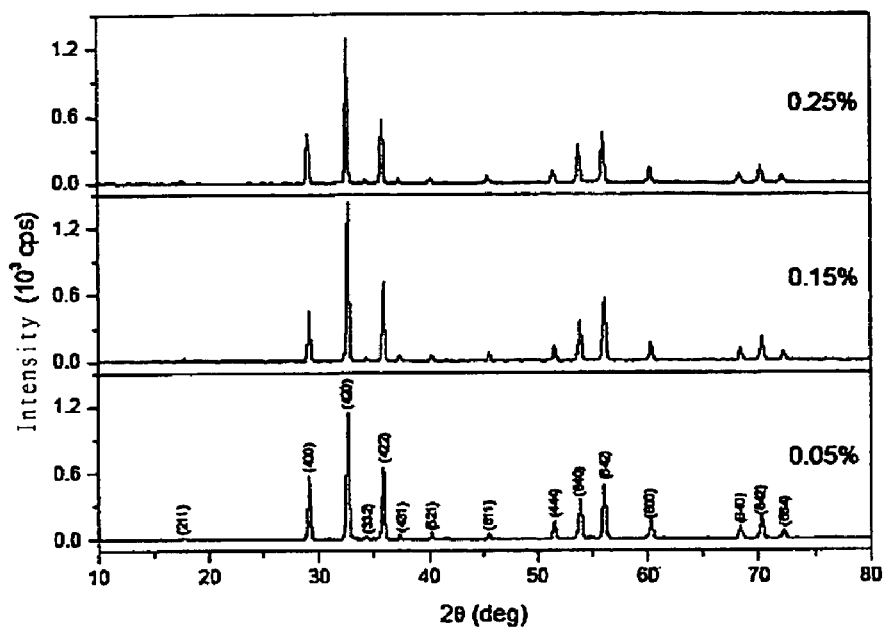
FIG. 27A shows comparison of XRD profiles from a series of $Y_3Ga_5O_{12}:Mn^{4+}$ phosphor composition samples doped with various concentrations of $Mn^{4+}$.
Figure 27B:
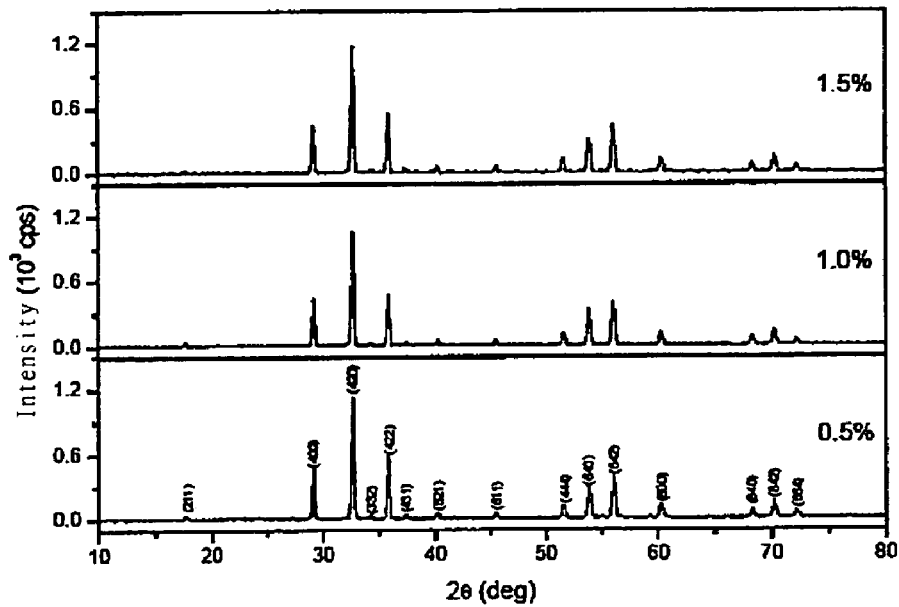
FIG. 27B shows comparison of XRD profiles from a series of $Y_3Ga_5O_{12}:Mn^{4+}$ phosphor composition samples doped with various concentrations of $Mn^{4+}$.

FIGS. 27A and 27B show XRD profiles from a series of $Y_3Ga_5O_{12}:Mn^{4+}$ samples doped with various concentrations of $Mn^{4+}$. As can be seen, structure is not affected by introduction of $Mn^{4+}$ ion.

(Optical Property of $Y_3Ga_5O_{12}:Mn^{4+}$ Phosphor Composition)

Figure 28:
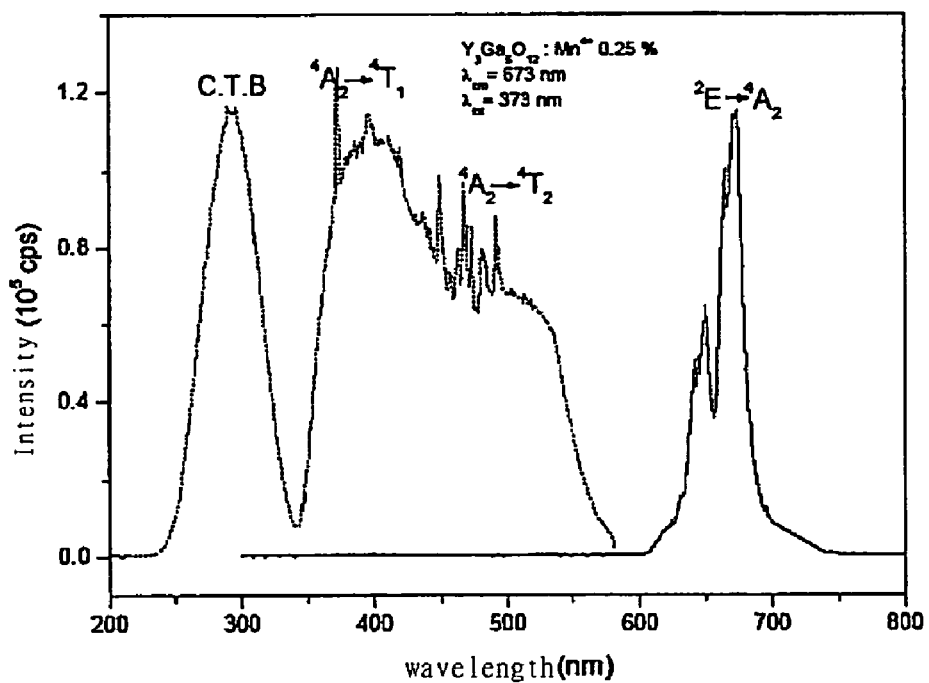
FIG. 28 shows excitation and photoluminescence spectra of $Y_3Ga_5O_{12}:Mn^{4+}$ phosphor composition.

FIG. 28 shows the photoluminescence spectra of $Y_3Ga_5O_{12}:Mn^{4+}$ phosphor composition synthesized. In dashed line part at left hand, absorption peak at 293 nm originates from charge transfer band of $O^{2-}2P \rightarrow Mn^{4+}3d$, and those at 395 and 492 nm correspond to $^4A_2 \rightarrow {}^4T_1$ and $^4A_2 \rightarrow {}^4T_2$, respectively. In solid line part at right hand, emission peaks in 600~750 nm originate from $^2E \rightarrow {}^4A_2$.

Figure 29:
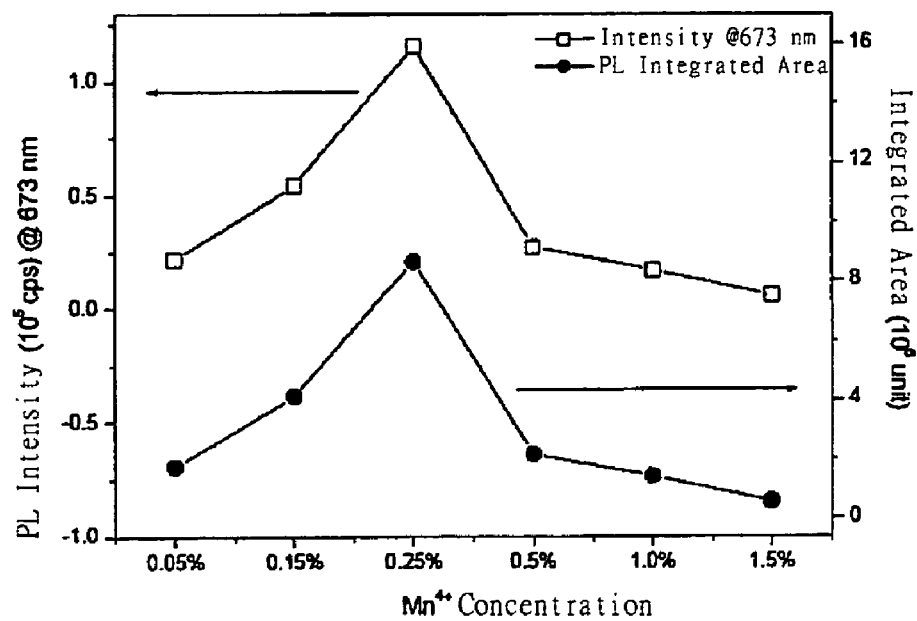
FIG. 29 shows concentration effect of $Y_3Ga_5O_{12}:Mn^{4+}$ phosphor composition doped with various concentrations of $Mn^{4+}$.

FIG. 29 shows the comparison of intensity and integrated area of $Y_3Ga_5O_{12}:Mn^{4+}$ phosphor composition doped with various concentrations of $Mn^{4+}$. As can be seen, maximum is obtained at 0.25 mol %.

Figure 30:
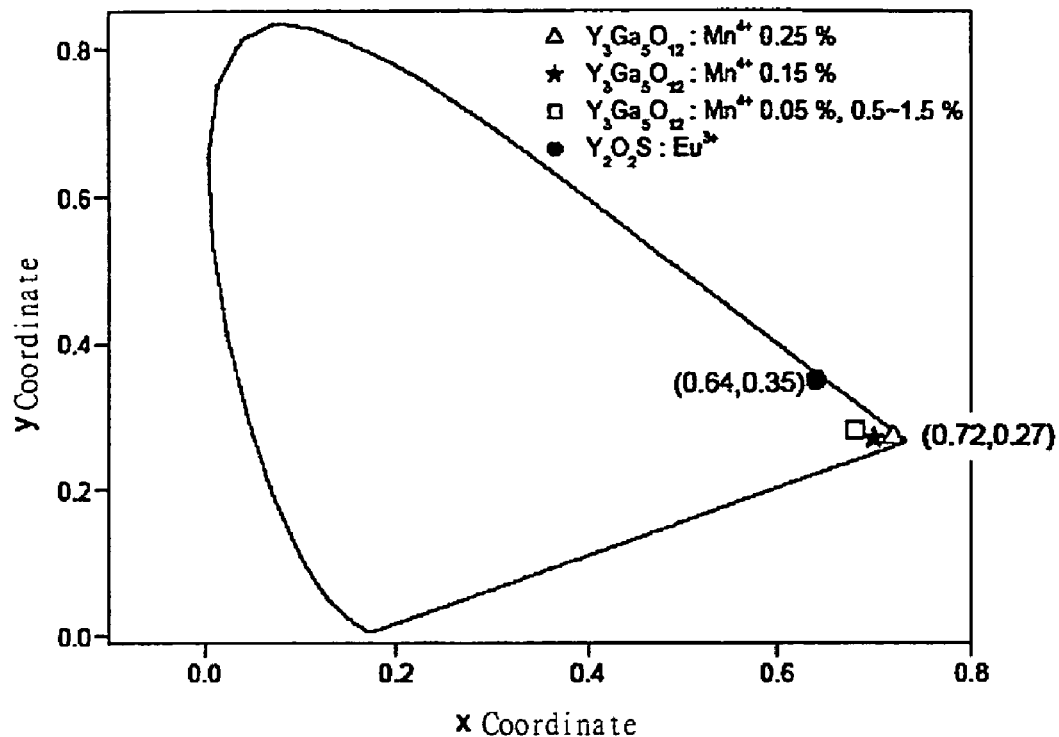
FIG. 30 shows C.I.E. chromaticity coordinates of $Y_3Ga_5O_{12}:Mn^{4+}$ phosphor composition.

FIG. 30 shows the C.I.E. chromaticity coordinate of $Y_3Ga_5O_{12}:Mn^{4+}$ phosphor composition, wherein 'Δ' represents the best chromaticity coordinate value of sample doped with 0.25 mol % of $Mn^{4+}$, (0.72, 0.27), '*' represents that of doped with 0.15 mol %, and '□' represents that of doped with 0.5~1.5 mol %. The best sample is obtained at 0.25 mol %.

Table 6 shows the comparison of chromaticity coordinate values of $Y_3Ga_5O_{12}:Mn^{4+}$ phosphor compositions doped with various concentration of $Mn^{4+}$.

TABLE 6

| $Mn^{4+}$ mol % | x ordinate value | y ordinate value |
|---|---|---|
| 0.05 | 0.68 | 0.28 |
| 0.15 | 0.7 | 0.27 |
| 0.25 | 0.72 | 0.27 |
| 0.5 | 0.68 | 0.28 |
| 1.0 | 0.68 | 0.28 |
| 1.5 | 0.68 | 0.28 |

As described above, the present invention provides $Mg_{14}Ge_5O_{24}:Mn^{4+}$, $SrGe_4O_9:Mn^{4+}$, $Mg_2TiO_4:Mn^{4+}$, $Zn_2Ti_{(1-d)}O_4:Mn^{4+}$, $SrMgAl_{10}O_{17}:Mn^{4+}$, and $Y_3Ga_5O_{12}:Mn^{4+}$ phosphor compositions which are useful for the present light emission device. Best compositional ratio, physical and optical properties of the present phosphor compositions are shown in Table 7.

TABLE 7

| Composition No. | Chemical Formula | Compositional Ratio | Synthesis Temp. | Optical Property C.I.E. Coordinate | Wavelength |
|---|---|---|---|---|---|
| 1. | $Mg_{14}Ge_5O_{24}$ | $Mg_{14}(Ge_{4.9875}Mn_{0.0125})O_2$ | 1200° C. | 0.73, 0.27 | $\lambda_{em}$ = 659 nm<br>$\lambda_{ex}$ = 419 nm |
| 2. | $SrGe_4O_9$ | $Sr(Ge_{3.96}Mn_{0.04})O_9$ | 1100° C. | 0.73, 0.26 | $\lambda_{em}$ = 655 nm<br>$\lambda_{ex}$ = 290 nm |
| 3. | $Mg_2TiO_4$ | $Mg_2(Ti_{0.9975}MN_{0.0025})O_4$ | 1300° C. | 0.73, 0.26 | $\lambda_{em}$ = 656 nm<br>$\lambda_{ex}$ = 352 nm |
| 4. | $Zn_2TiO_4$ | $Zn_2(Ti_{0.995}Mn_{0.005})O_4$ | 1300° C. | 0.72, 0.27 | $\lambda_{em}$ = 675 nm<br>$\lambda_{ex}$ = 362 nm |
| 5. | $SrMgAl_{10}O_{17}$ | $SrMg(Al_{9.975}Mn_{0.025})O_{17}$ | 1600° C. | 0.73, 0.27 | $\lambda_{em}$ = 658 nm<br>$\lambda_{ex}$ = 340 nm |
| 6. | $Y_3Ga_5O_{12}$ | $Y_3(Ga_{4.9875}Mn_{0.0125})O_{12}$ | 1400° C. | 0.72, 0.27 | $\lambda_{em}$ = 673 nm<br>$\lambda_{ex}$ = 373 nm |

In the above table, $\lambda_{ex}$ represents preferred excitation wavelength for phosphor composition, and $\lambda_{em}$ represents emission wavelength of emitting light from phosphor composition. The present light emission device is consisted of above compositions. The present composition is of high red color saturation with C.I.E. chromaticity coordinate value of x ranging from 0.72 to 0.73 and y ranging from 0.26 to 0.27. Not only the present composition is useful as light source for blue-near ultraviolet LEDs, but also emission wavelength thereof at 660 nm is applicable to current commercial medical instruments, as well as many other applications.

The present invention is disclosed above with reference to the preferred embodiments; however, the embodiments are not used as limitation of the present. It is appreciated to those in this field that the variation and modification directed to the present invention not apart from the spirit and scope thereof can be made, and the scope of the present invention is covered in the attached claims.

We claim:

1. A light emitting device comprising a semiconductor light source emitting radiation at about 250 to 500 nm; and a phosphor composition radiationally coupled to the semiconductor light source, wherein the phosphor composition is selected from the group consisting of $SrGe_4O_9:Mn^{4+}$, $Zn_2TiO_4:Mn^{4+}$, and $Y_3Ga_5O_{12}:Mn^{4+}$.

2. The light emitting device as described in claim 1, wherein the light source is a light emitting diode.

3. The light emitting device as described in claim 2, wherein the light emitting diode comprises III-V, II-VI or IV-IV semiconductor.

4. The light emitting device as described in claim 1, wherein the light source is an organic light emitting device.

5. The light emitting device as described in claim 1, wherein the phosphor composition is coated on surface of the light source.

6. The light emitting device as described in claim 1, wherein the phosphor is $SrGe_4O_9:Mn^{4+}$, and the ratio that Mn substitutes Ge in $SrGe_4O_9:Mn^{4+}$ phosphor composition is 0.15-2.5 mol %.

7. The light emitting device as described in claim 1, wherein the phosphor in $Zn_2TiO_4:Mn^{4+}$, and the ratio that Mn substitutes Ti in $Zn_2TiO_4:Mn^{4+}$ phosphor composition is 0.05-2 mol %.

8. The light emitting device as described in claim 1, wherein the phosphor is $Y_3Ga_5O_{12}:Mn^{4+}$, and the ratio that Mn substitutes Ga in $Y_3Ga_5O_{12}:Mn^{4+}$ phosphor composition is 0.05-1.5 mol %.

9. The light emitting device as described in claim 1, wherein the phosphor composition is excited by light from the semiconductor light source and emits light with C.I.E. chromaticity coordinate value of x ranging from 0.68 to 0.73 and y ranging from 0.26 to 0.28.

10. The light emitting device as described in claim 1, wherein the phosphor composition is excited by light from the semiconductor light source and emits light with wavelength of 600 to 750 nm.

11. A method for producing $Zn_2TiO_4:Mn^{4+}$ phosphor composition, comprising the steps of:
1) stoichiometrically weighing materials ZnO, $TiO_2$ and $MnO_2$;
2) grinding and mixing the weighed materials into homogeneous powders;
3) sintering at 1200-1400° C. for 8 hours; and
4) annealing at 570° C. for 16 hours under oxygen.

12. A method for producing $SrGe_4O_9:Mn^{4+}$ phosphor, comprising the steps of:
1) stoichiometrically weighing materials $SrCO_3$, $GeO_2$ and $MnO_2$;
2) grinding and mixing the weighed materials into homogeneous powders; and
3) sintering at 1000-1100° C. for 8 hours.

13. A method for producing $Y_3Ga_5O_{12}:Mn^{4+}$ phosphor, comprising the steps of:
1) stoichiometrically weighing materials $Y_2O_3$, $Ga_2O_3$ and $MnO_2$;
2) grinding and mixing the weighed materials into homogeneous powders; and
3) sintering at 1000-1400° C. for 8 hours.

* * * * *